US012646545B2

(12) United States Patent　　Katayama

(10) Patent No.:　　US 12,646,545 B2
(45) Date of Patent:　　Jun. 2, 2026

(54) MEMORY DEVICE

(71) Applicant: Kioxia Corporation, Tokyo (JP)

(72) Inventor: Akira Katayama, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 153 days.

(21) Appl. No.: 18/599,986

(22) Filed: Mar. 8, 2024

(65) Prior Publication Data

US 2024/0312506 A1　　Sep. 19, 2024

(30) Foreign Application Priority Data

Mar. 16, 2023　(JP) ................................. 2023-042075
Jun. 23, 2023　(JP) ................................. 2023-103230

(51) Int. Cl.
*G11C 5/06*　　(2006.01)
*G11C 11/16*　　(2006.01)

(52) U.S. Cl.
CPC ........ *G11C 11/1673* (2013.01); *G11C 11/161* (2013.01)

(58) Field of Classification Search
CPC .......................... G11C 11/1673; G11C 11/161
See application file for complete search history.

(56) References Cited

U.S. PATENT DOCUMENTS

| | | | | | |
|---|---|---|---|---|---|
| 8,023,313 | B2 * | 9/2011 | Toda | ..................... | G11C 13/00 |
| | | | | | 365/210.12 |
| 9,830,986 | B2 | 11/2017 | Kim | | |
| 11,074,954 | B2 | 7/2021 | Osada et al. | | |
| 11,538,512 | B2 | 12/2022 | Katayama | | |
| 11,908,518 | B2 * | 2/2024 | Katayama | .............. | G11C 5/063 |
| 2020/0302989 | A1 * | 9/2020 | Osada | ................... | G11C 11/161 |
| 2022/0293155 | A1 * | 9/2022 | Katayama | ........... | G11C 11/1659 |
| 2023/0410853 | A1 | 12/2023 | Katayama et al. | | |

FOREIGN PATENT DOCUMENTS

| | | |
|---|---|---|
| JP | 2010055719 A | 3/2010 |
| JP | 2020155186 A | 9/2020 |
| JP | 2022137794 A | 9/2022 |

* cited by examiner

*Primary Examiner* — Min Huang
(74) *Attorney, Agent, or Firm* — Holtz, Holtz & Volek PC

(57) ABSTRACT

A memory cell includes first and second ends. A first interconnect is coupled to the first end. A first switch is coupled between the first interconnect and a first node that receives a first voltage. A second interconnect is coupled to the second end. A second switch includes a third end coupled to the second interconnect and a fourth end. A third interconnect is coupled to the fourth end. A third switch is coupled between the third interconnect and a second node that receives a second voltage different from the first voltage. A third voltage between the second and first voltages is applied to the first and second interconnects. The third and second switches are respectively turned off and on after the third switch is turned on and after the application of the third voltage. The first switch is turned off after the application of the third voltage.

14 Claims, 24 Drawing Sheets

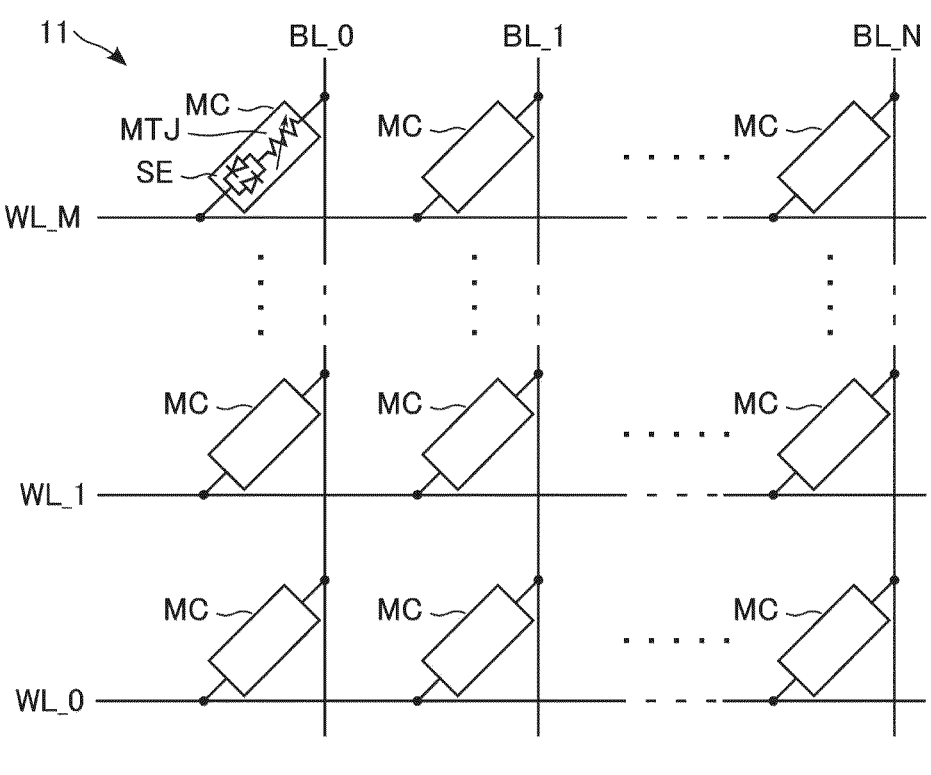
F I G. 2
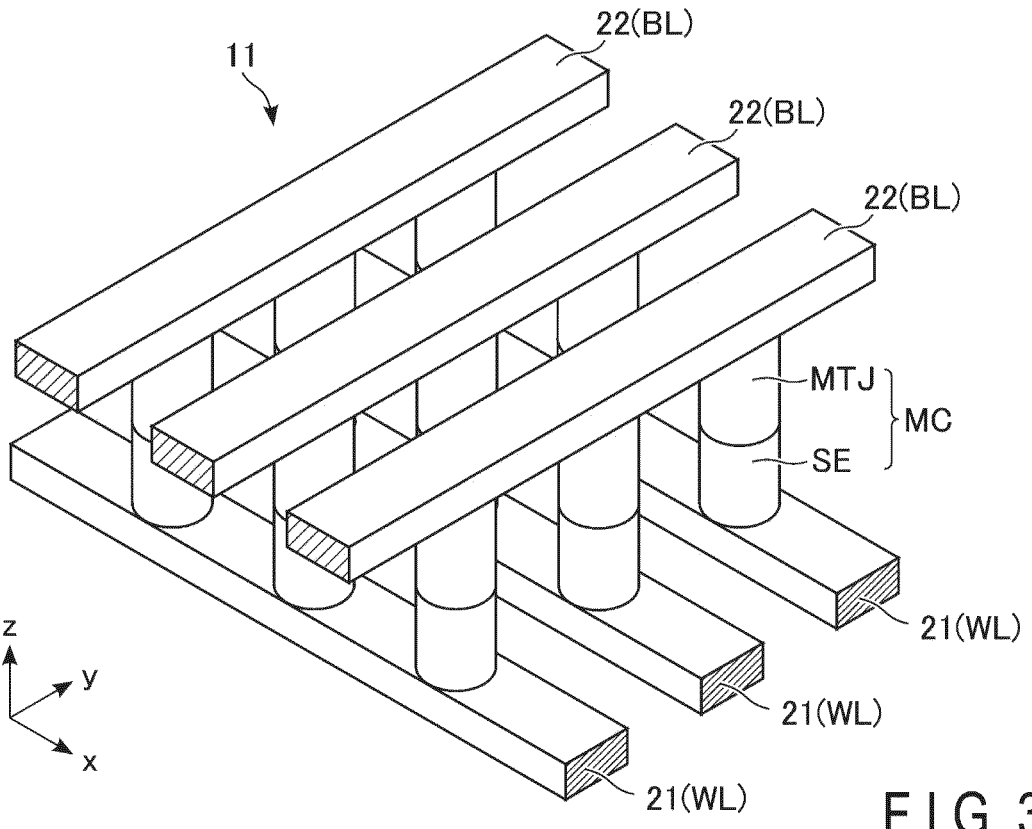
F I G. 3

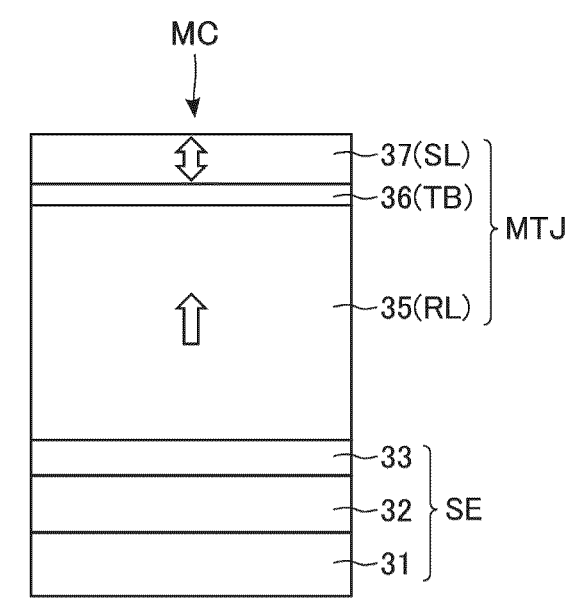
F I G. 4
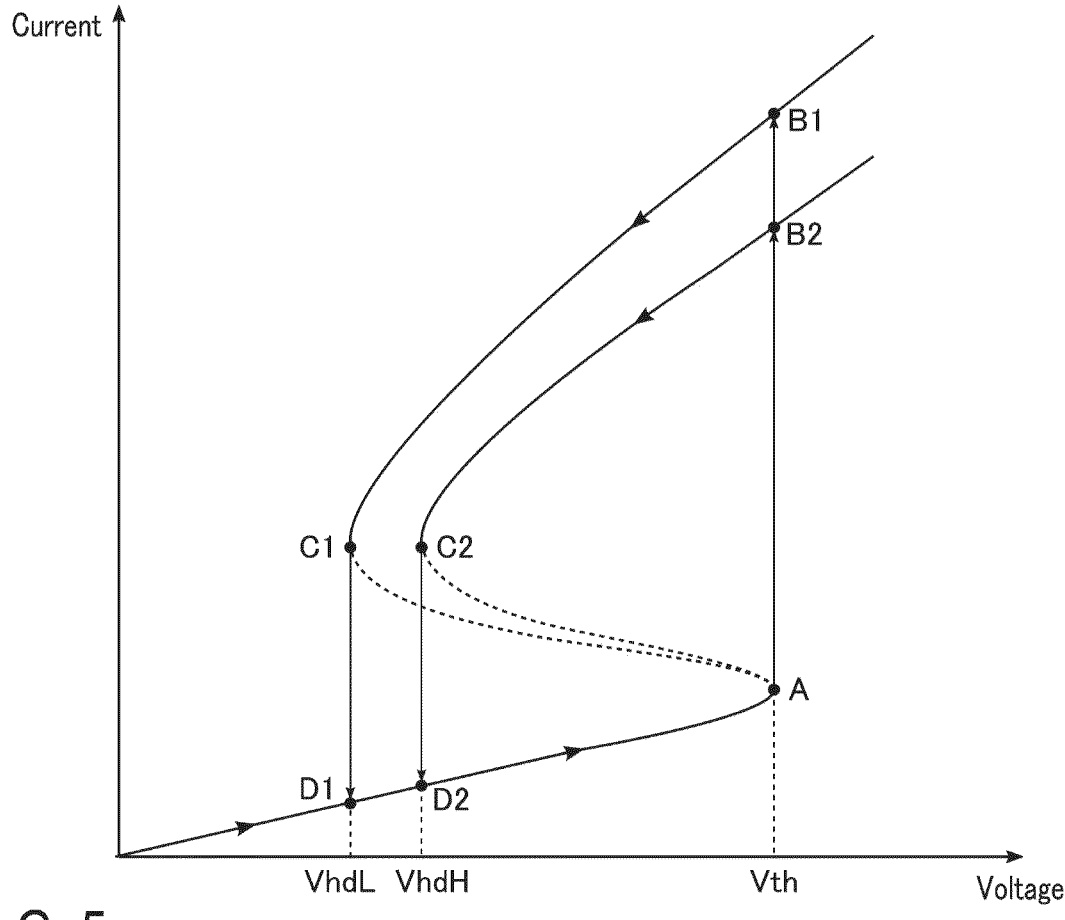
F I G. 5

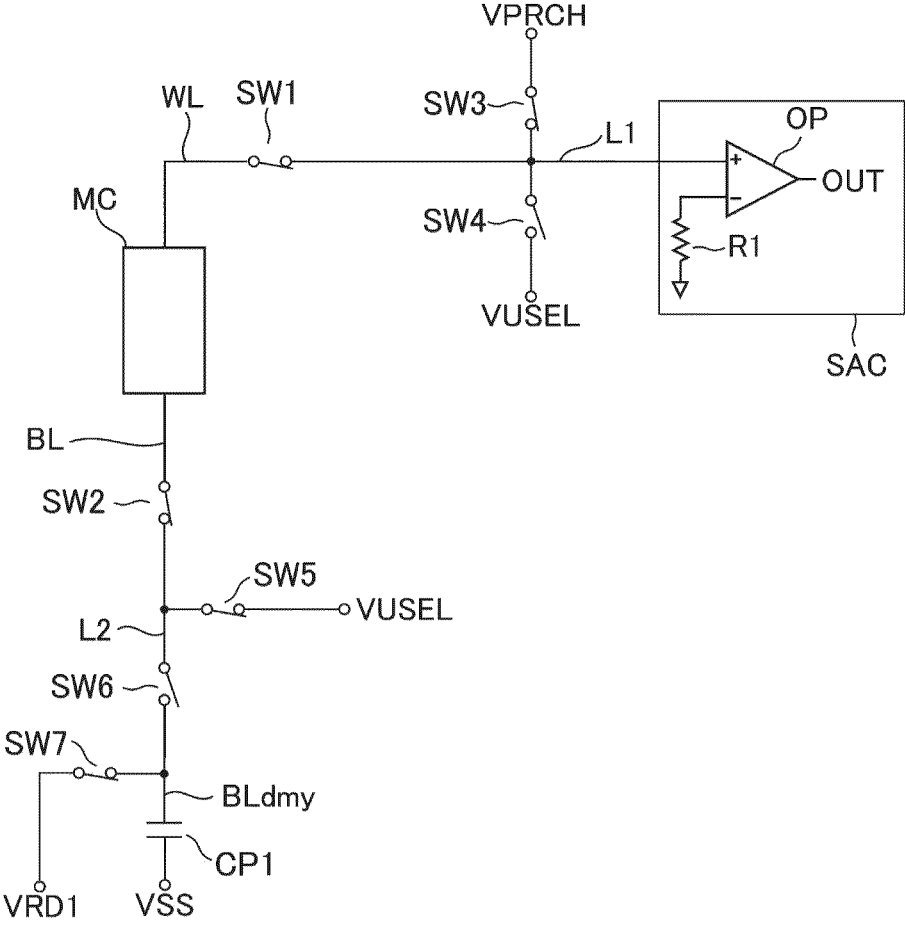
F I G. 8

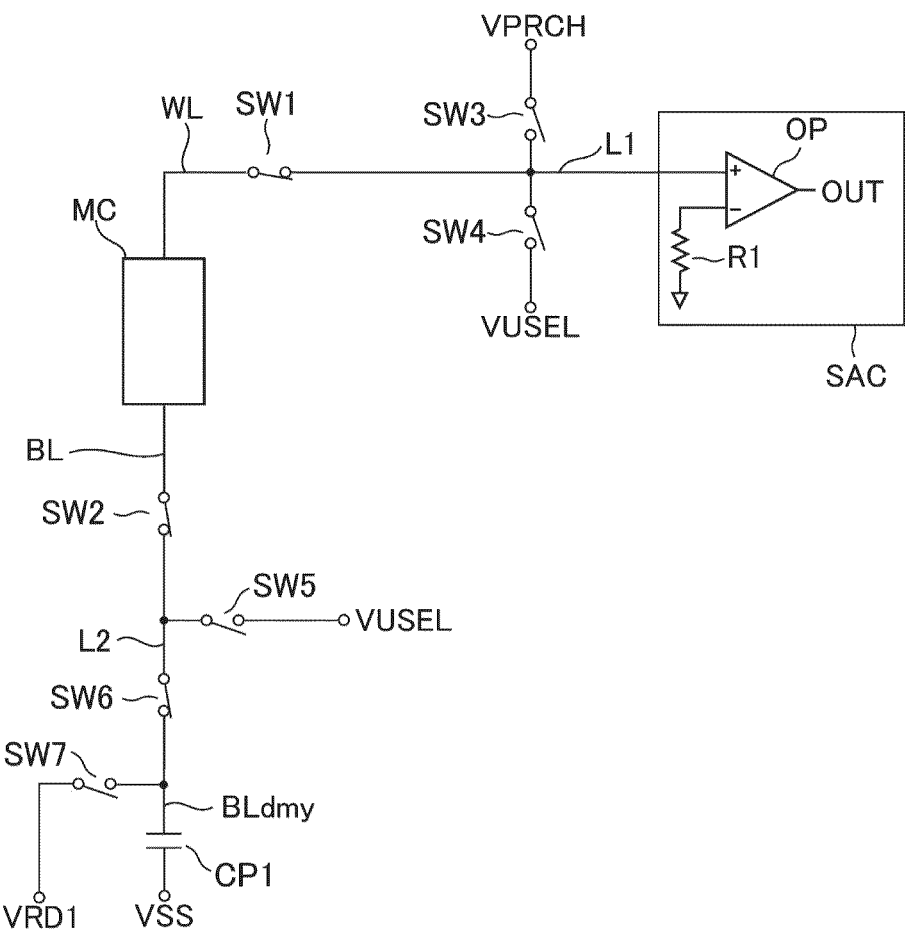
F I G. 9

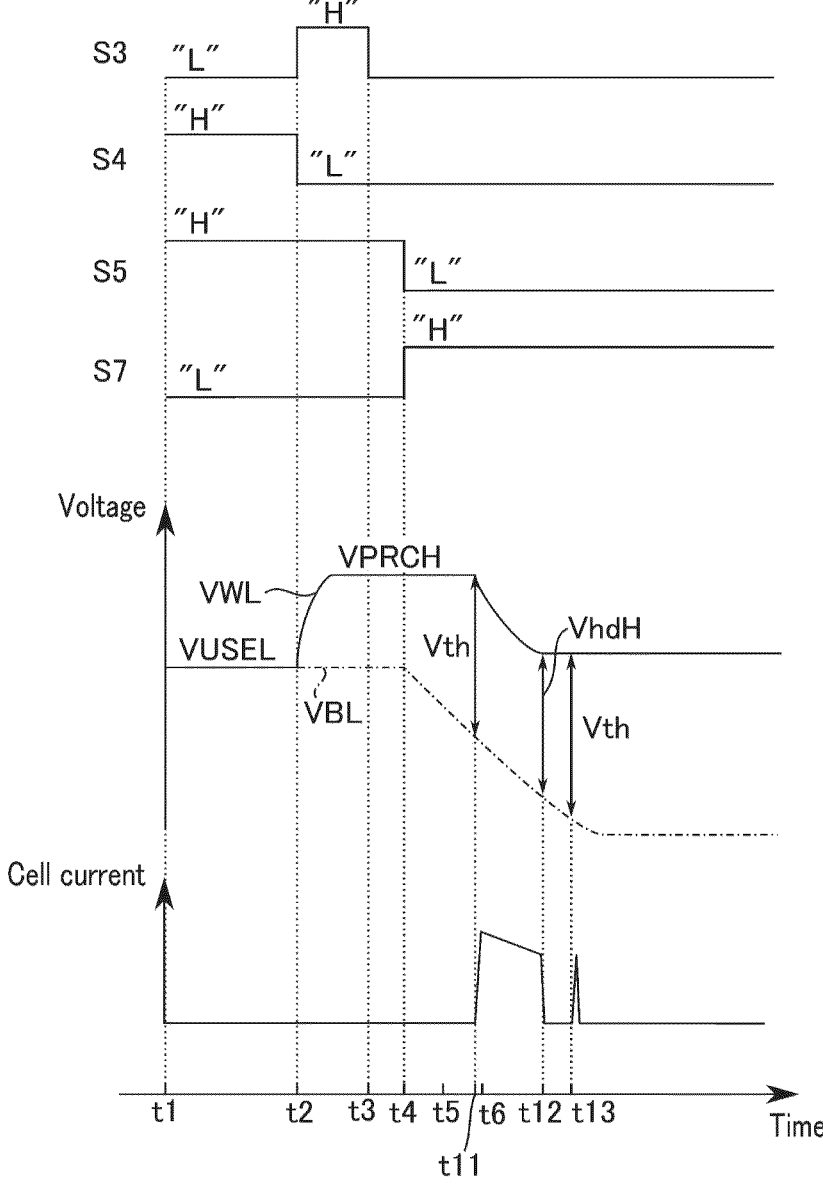
F I G. 10

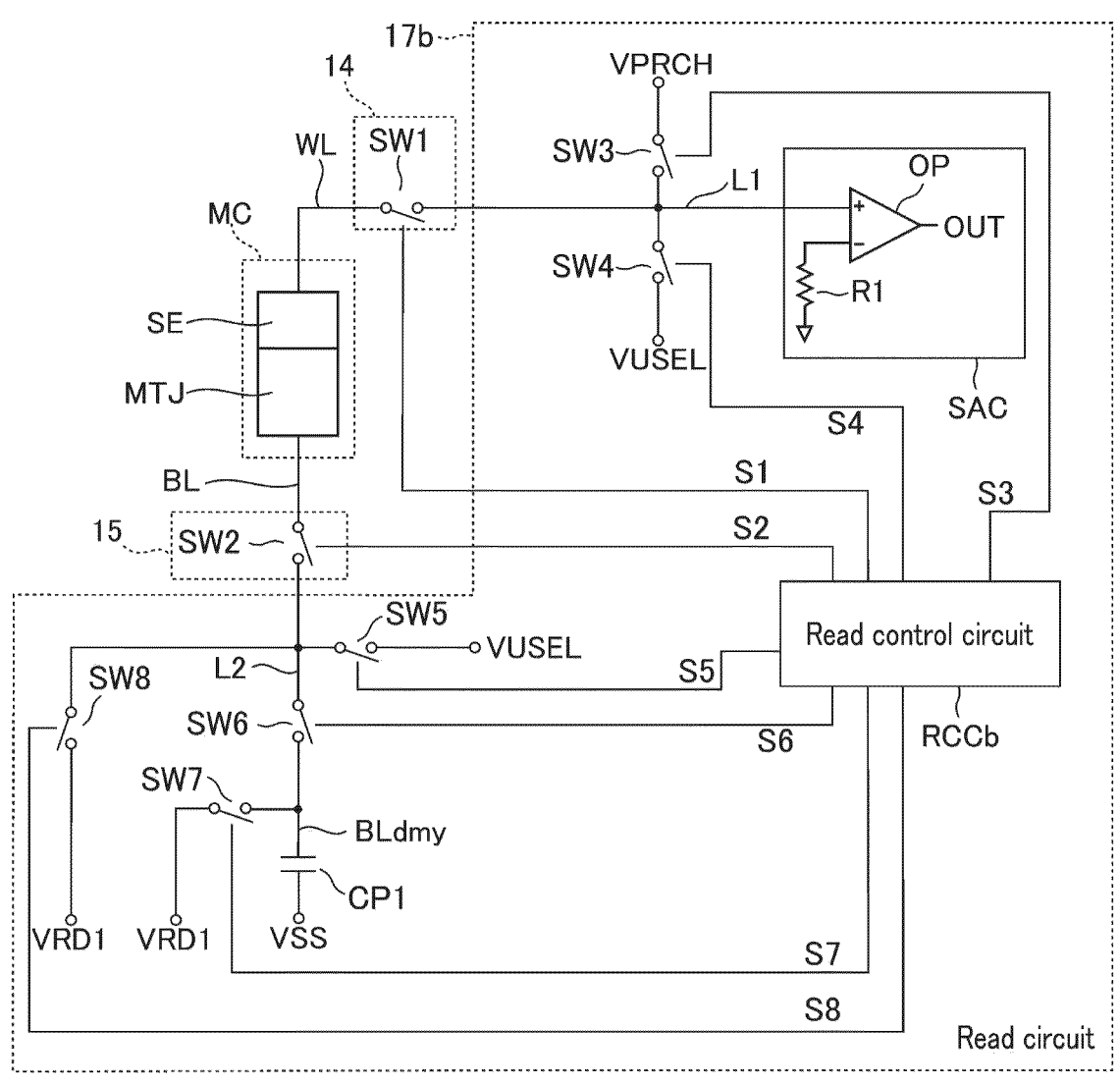
F I G. 11

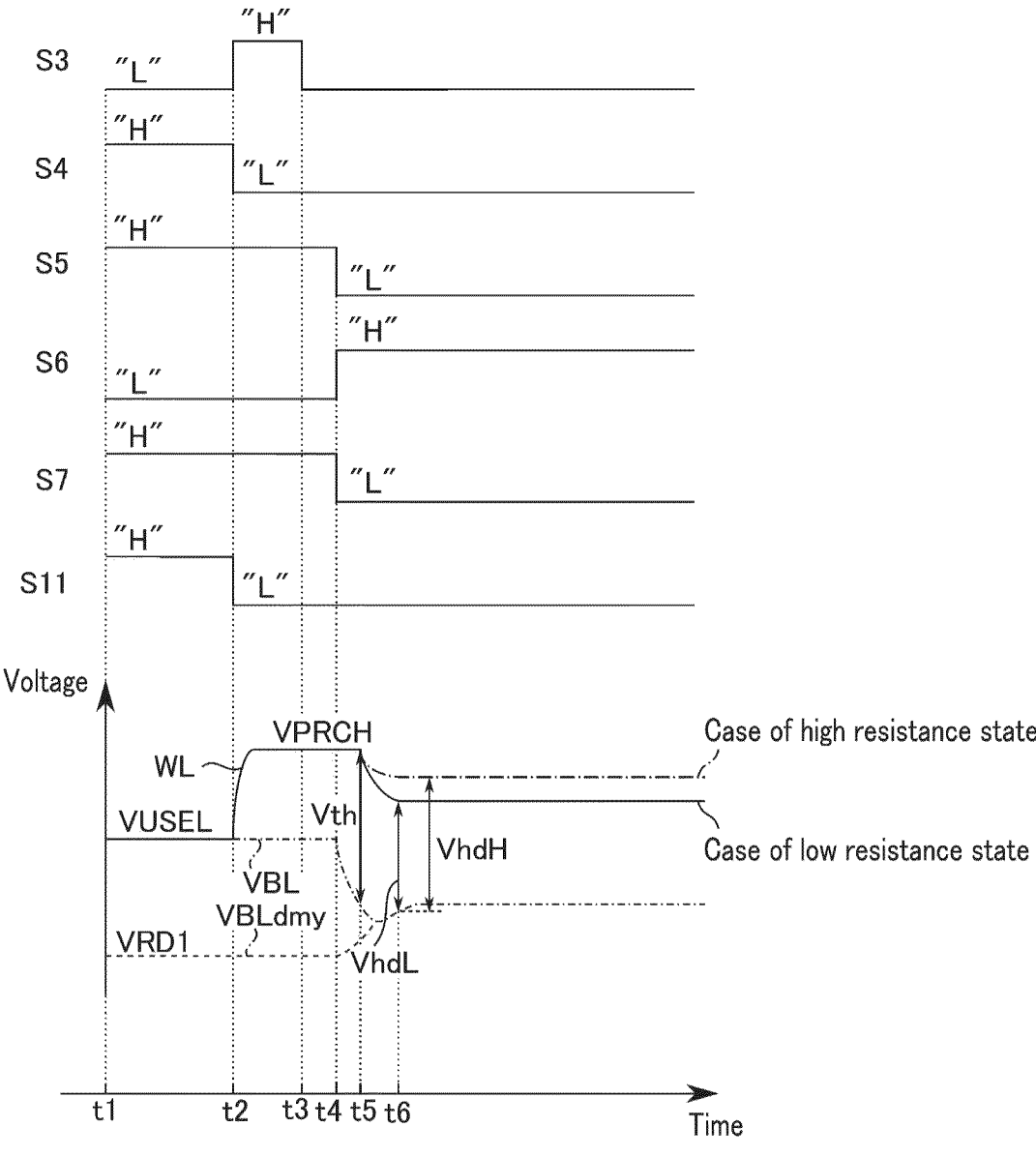
F I G. 14

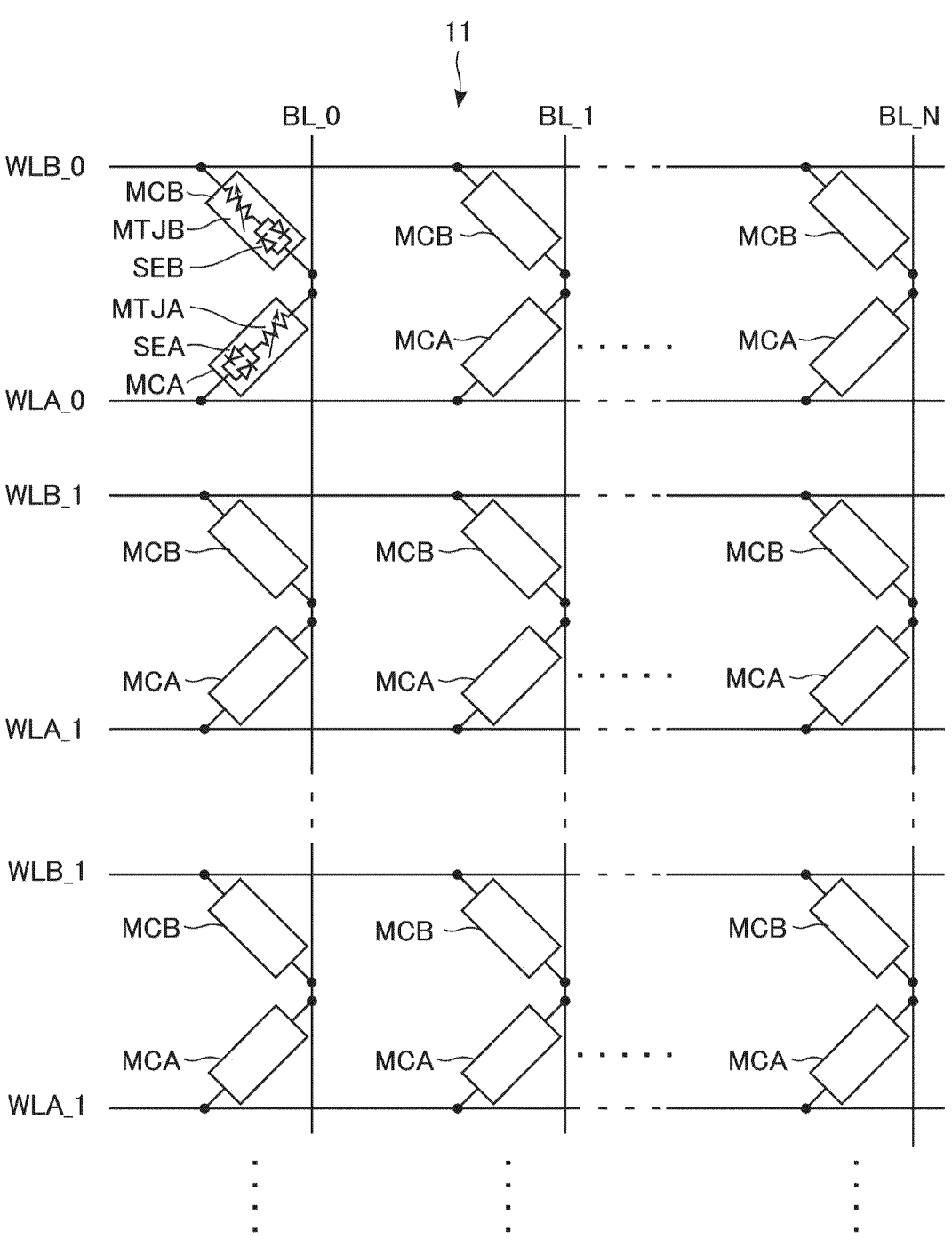
F I G. 15

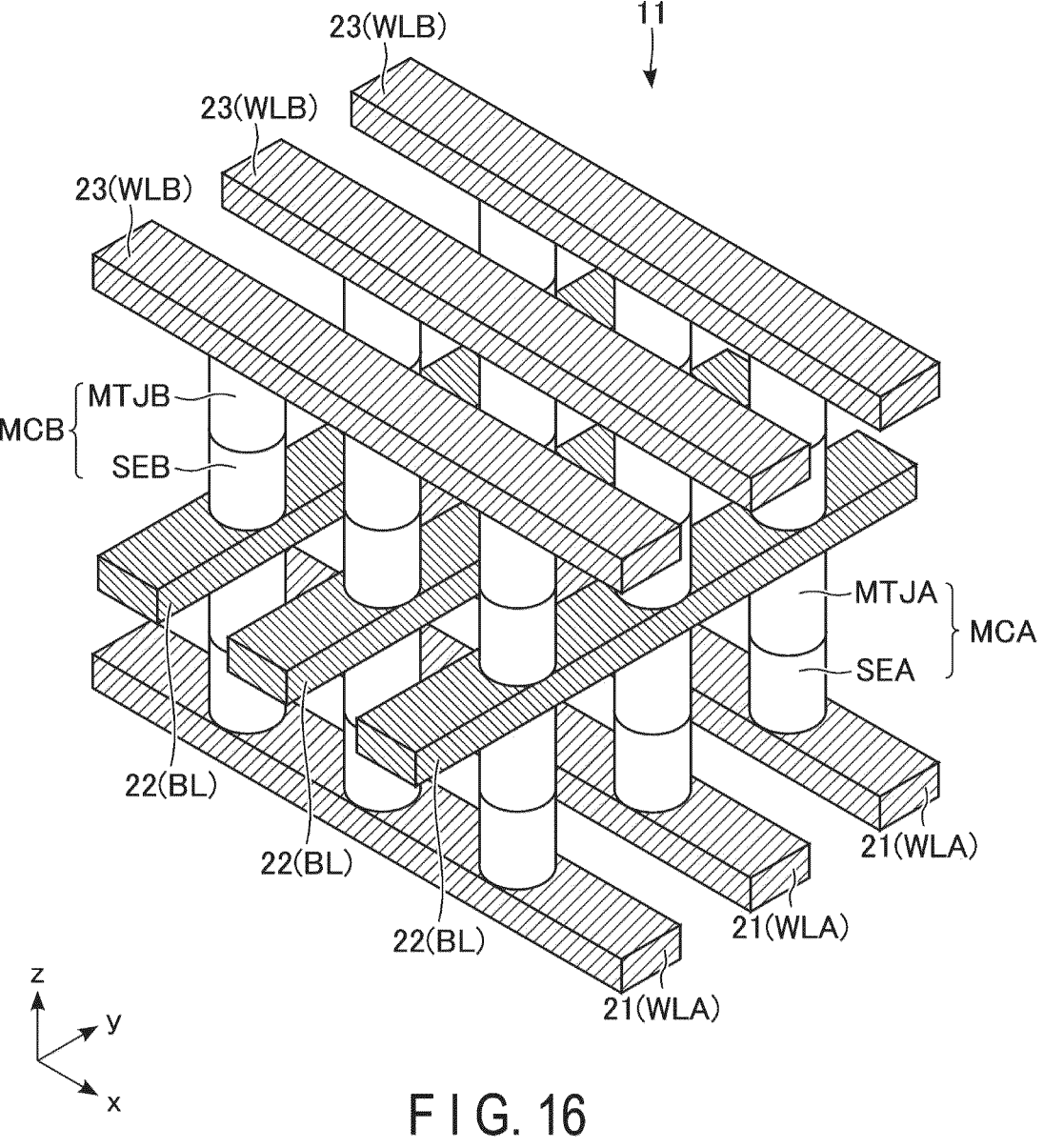
F I G. 16

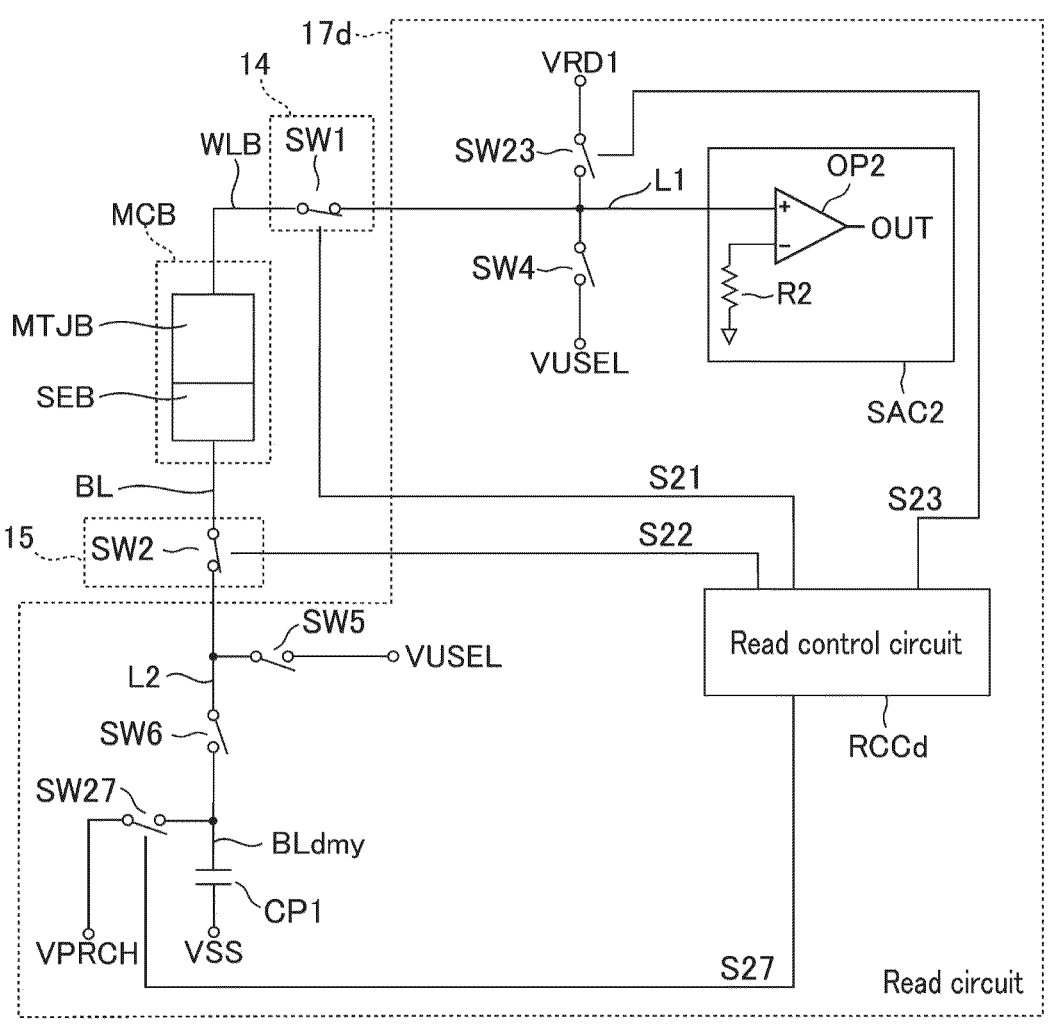
F I G. 17

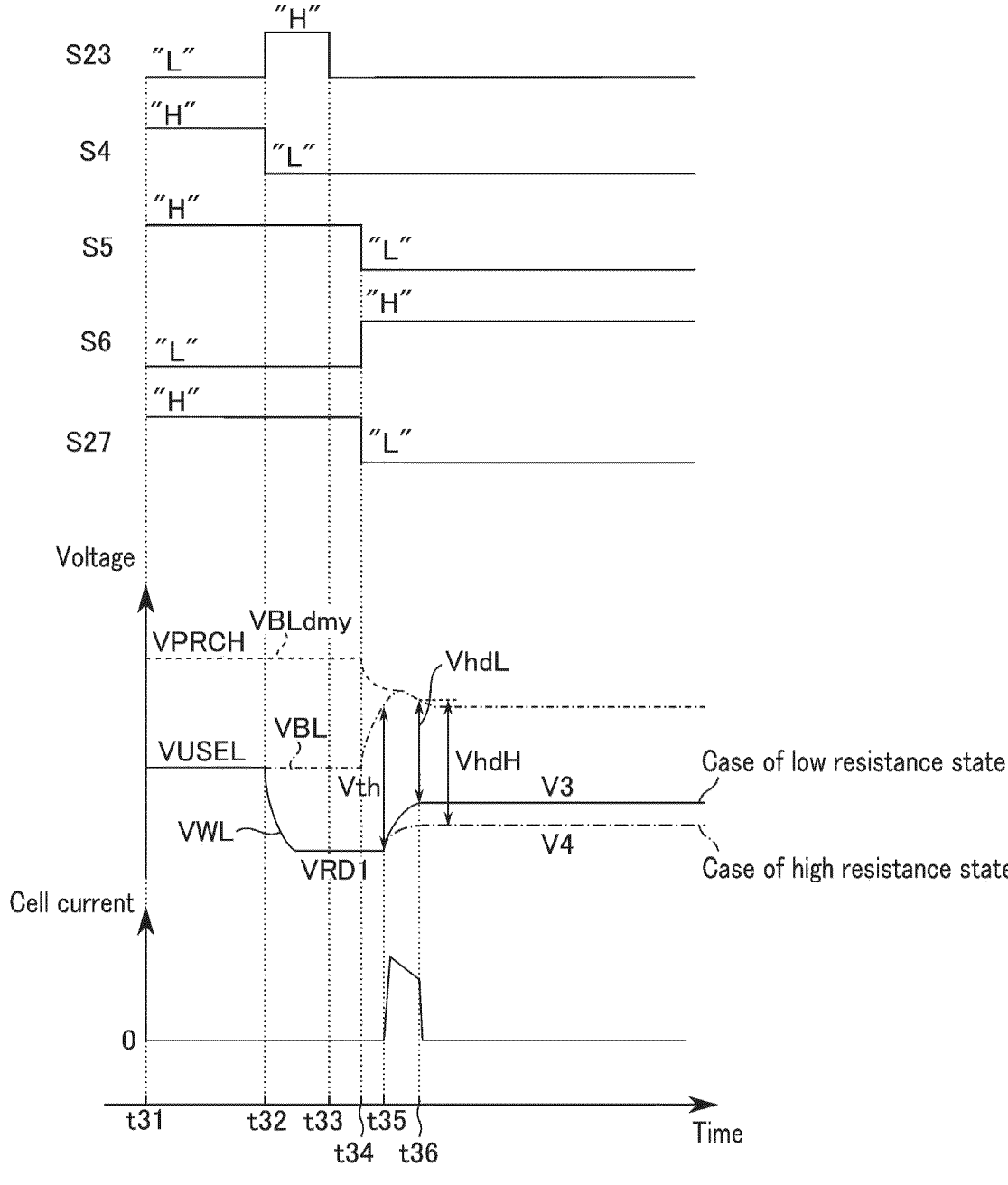
F I G. 18

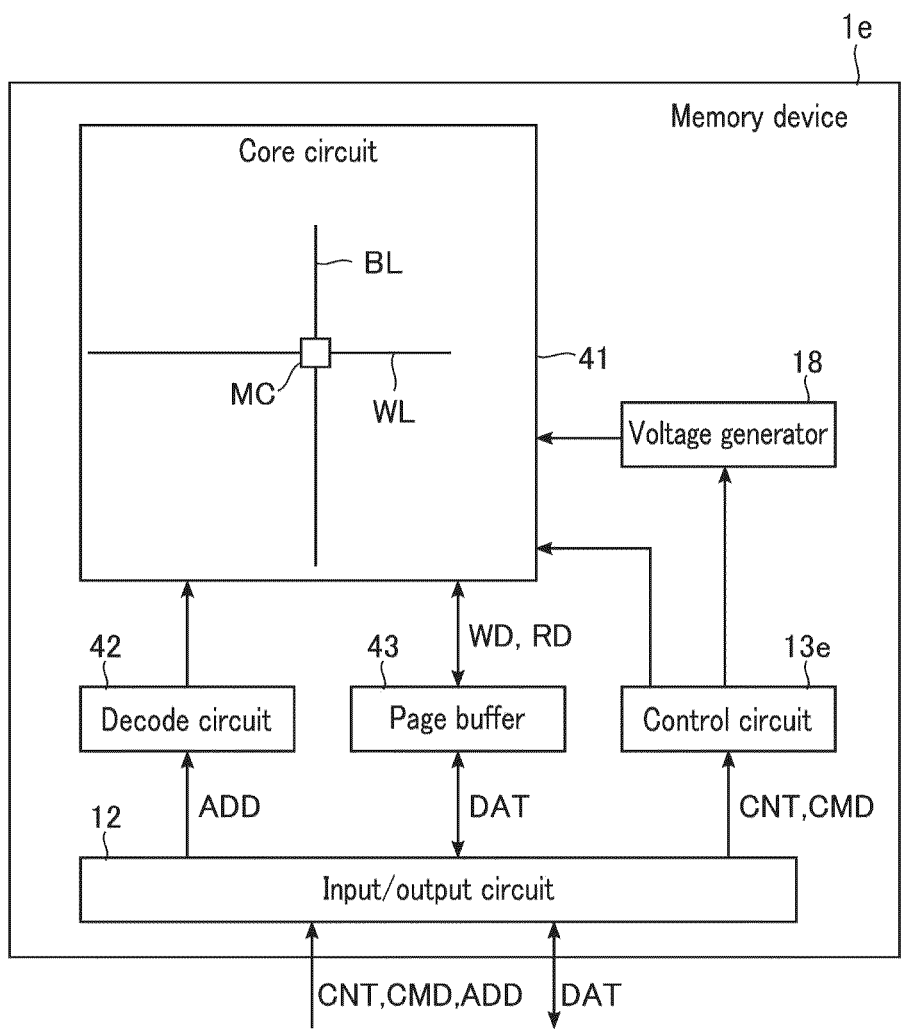
F I G. 19

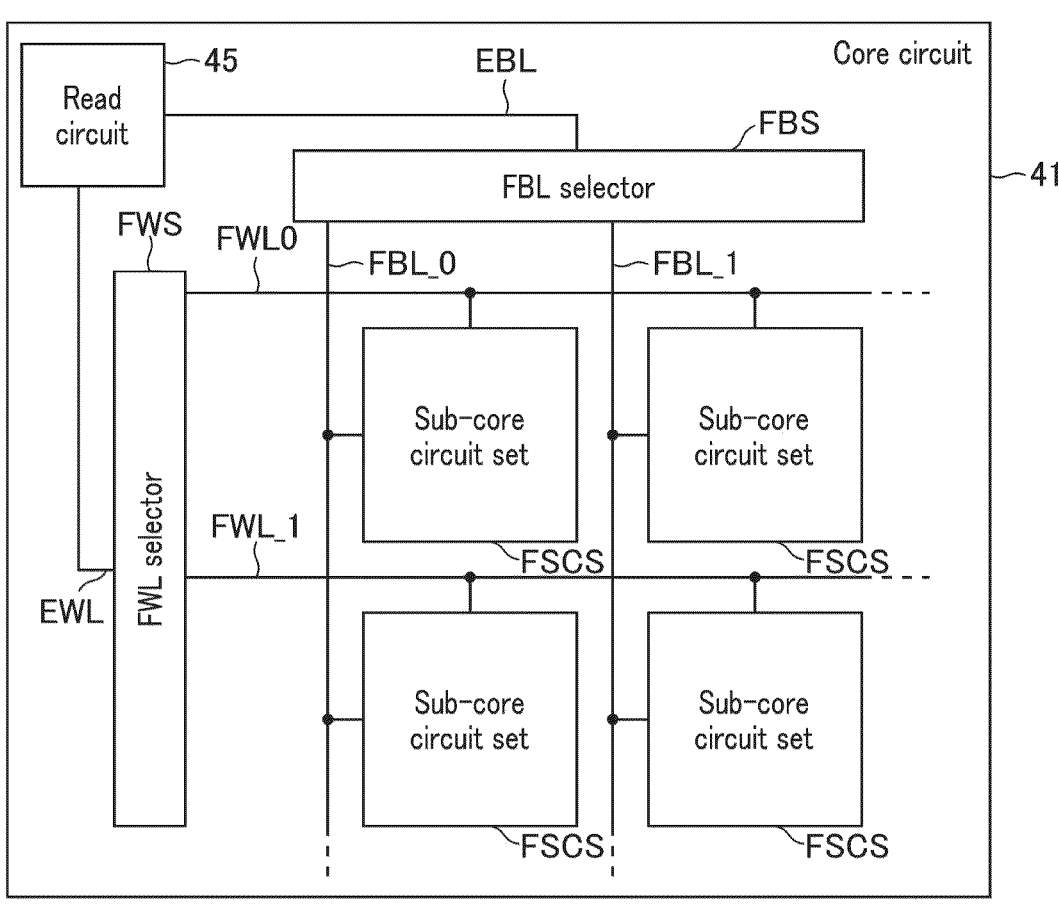
F I G. 20
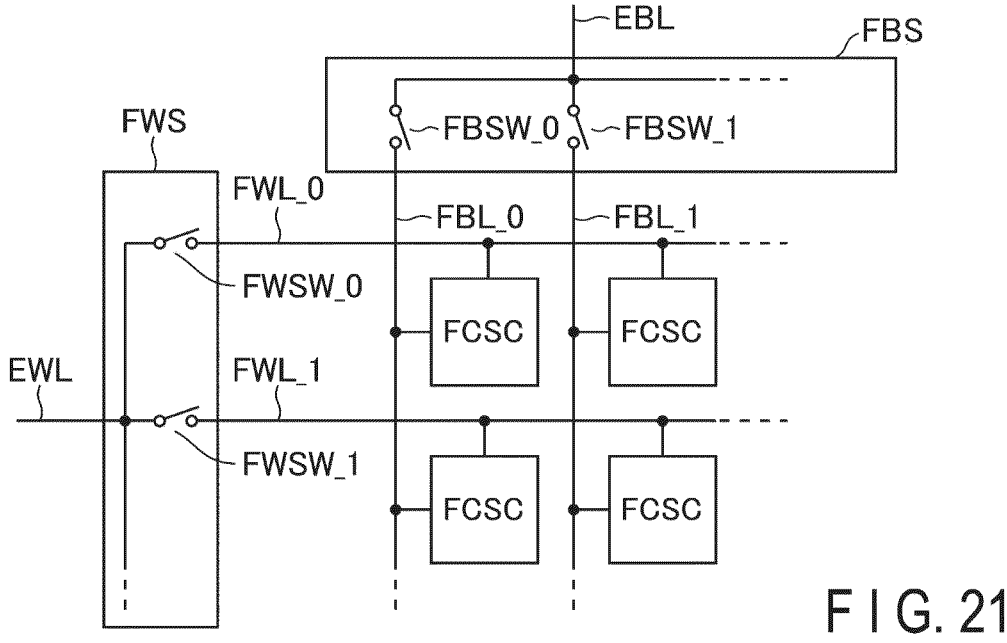
F I G. 21

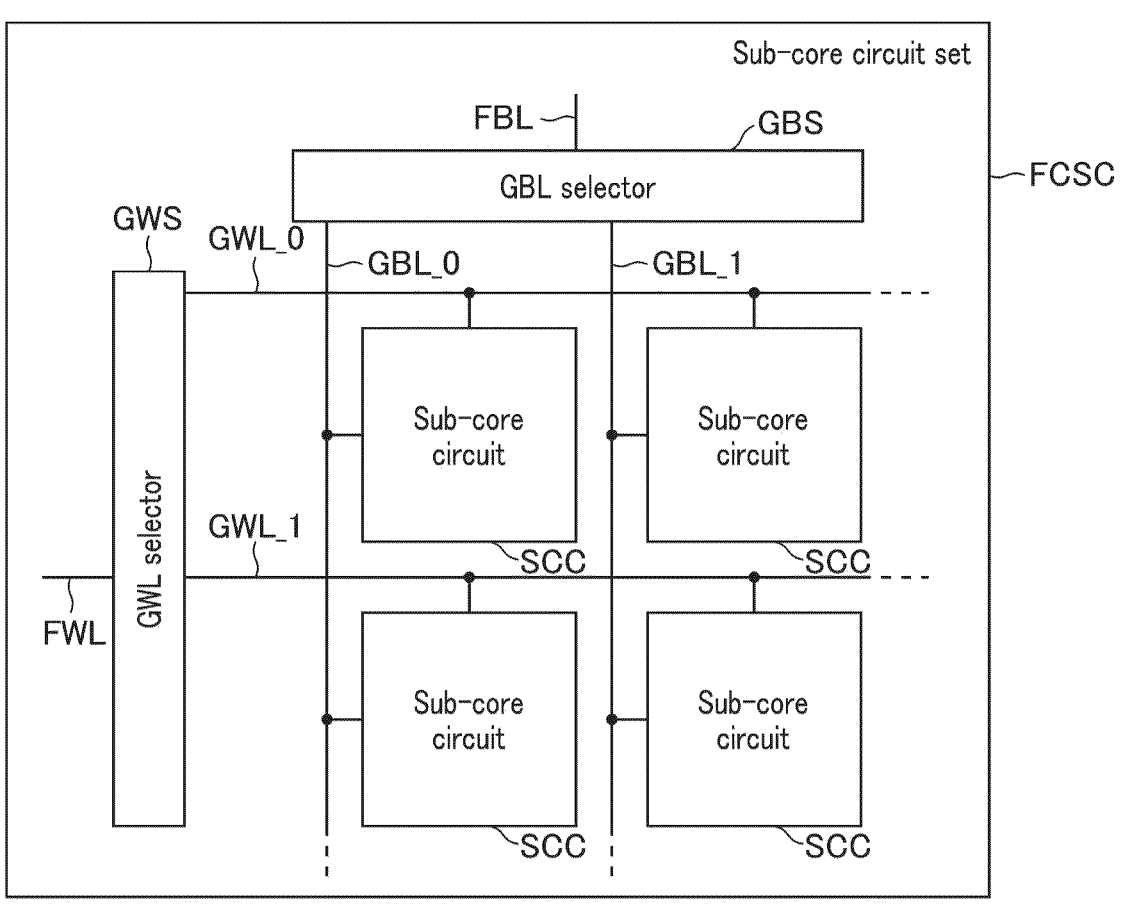
F I G. 22
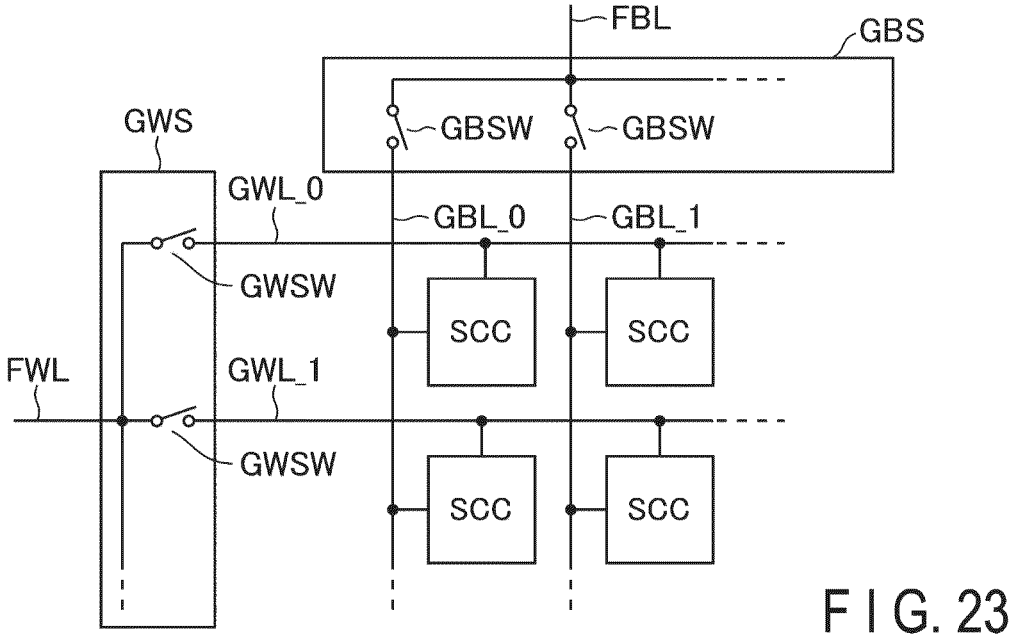
F I G. 23

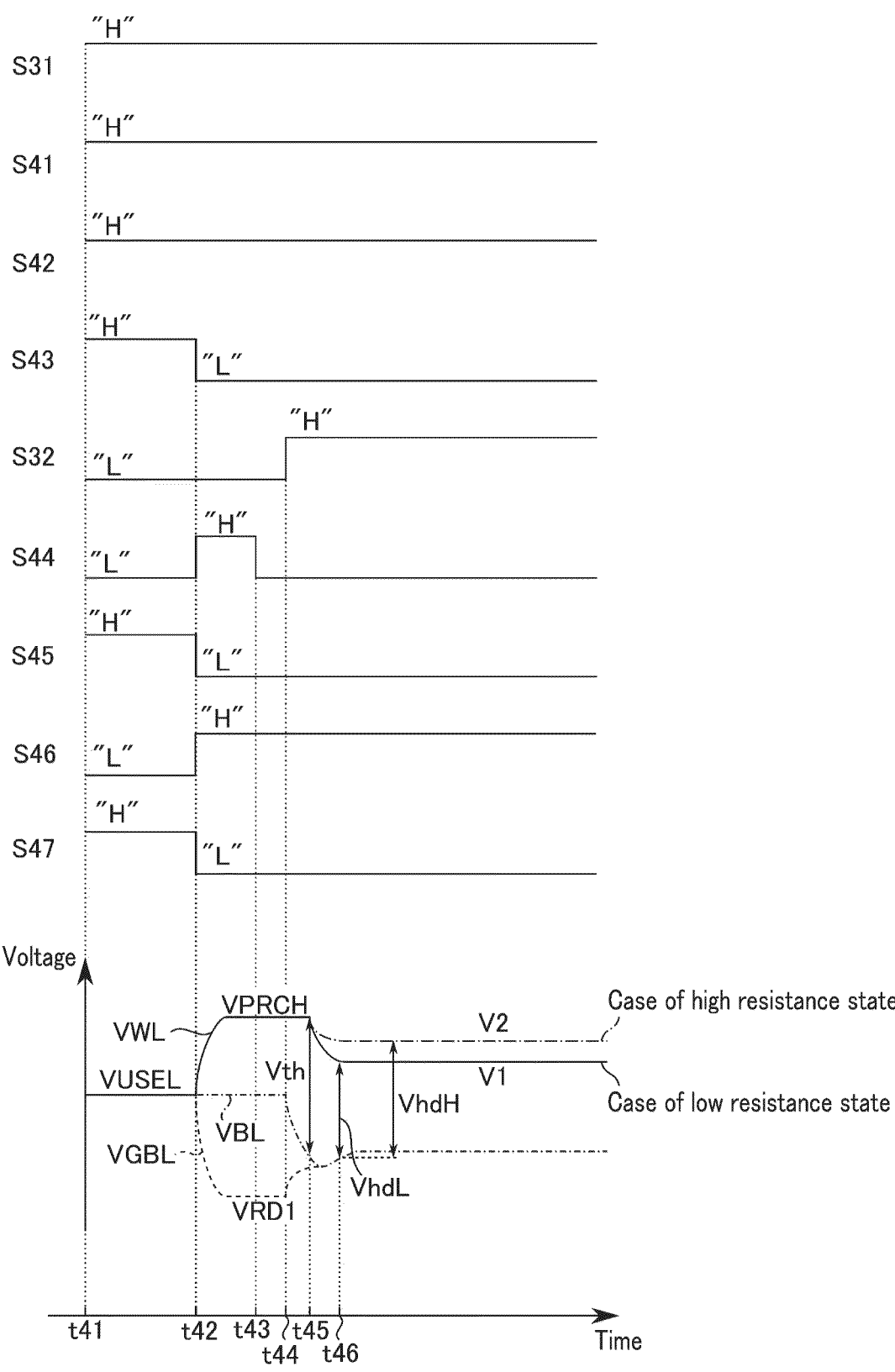
F I G. 27

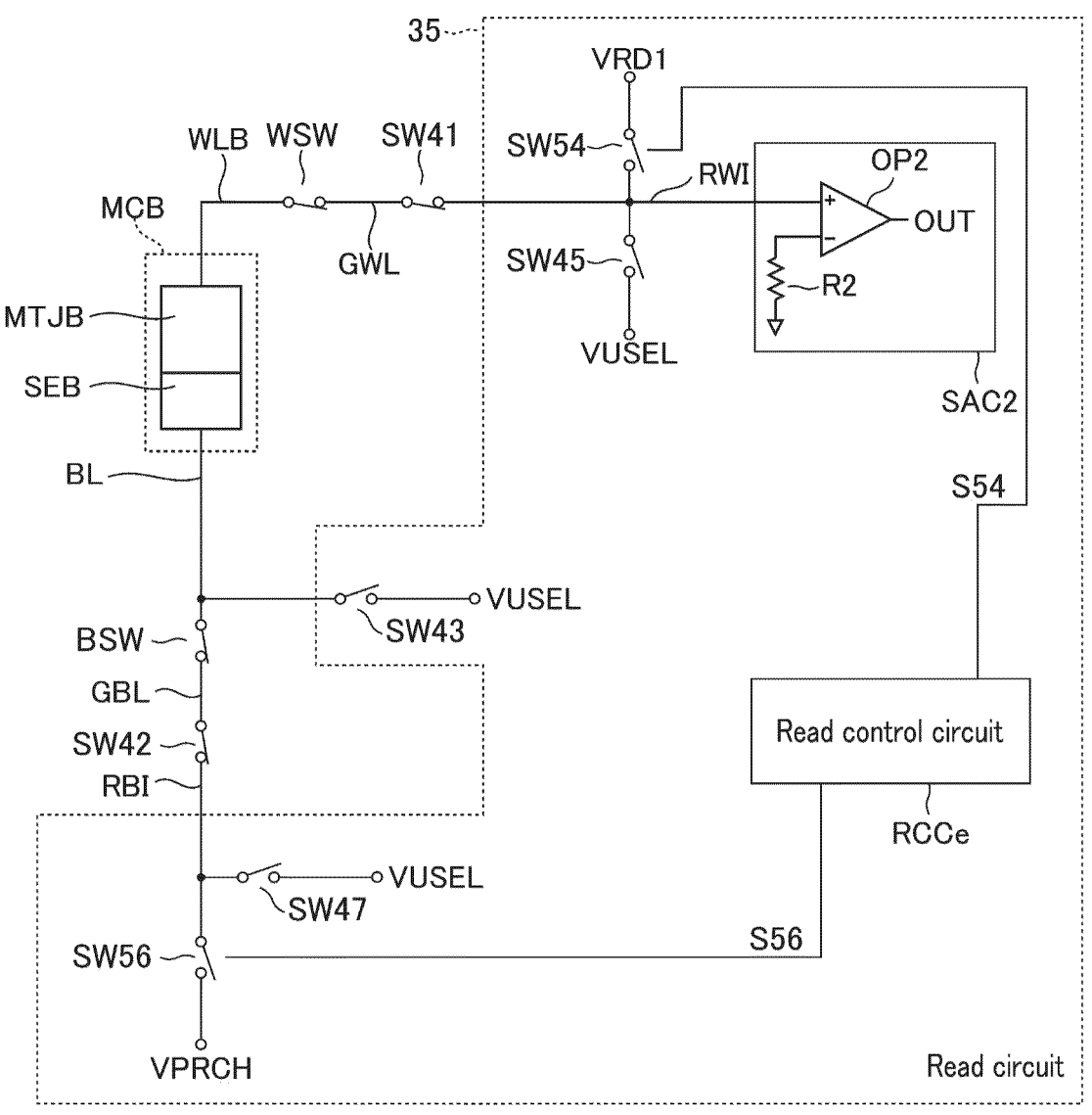
F I G. 28

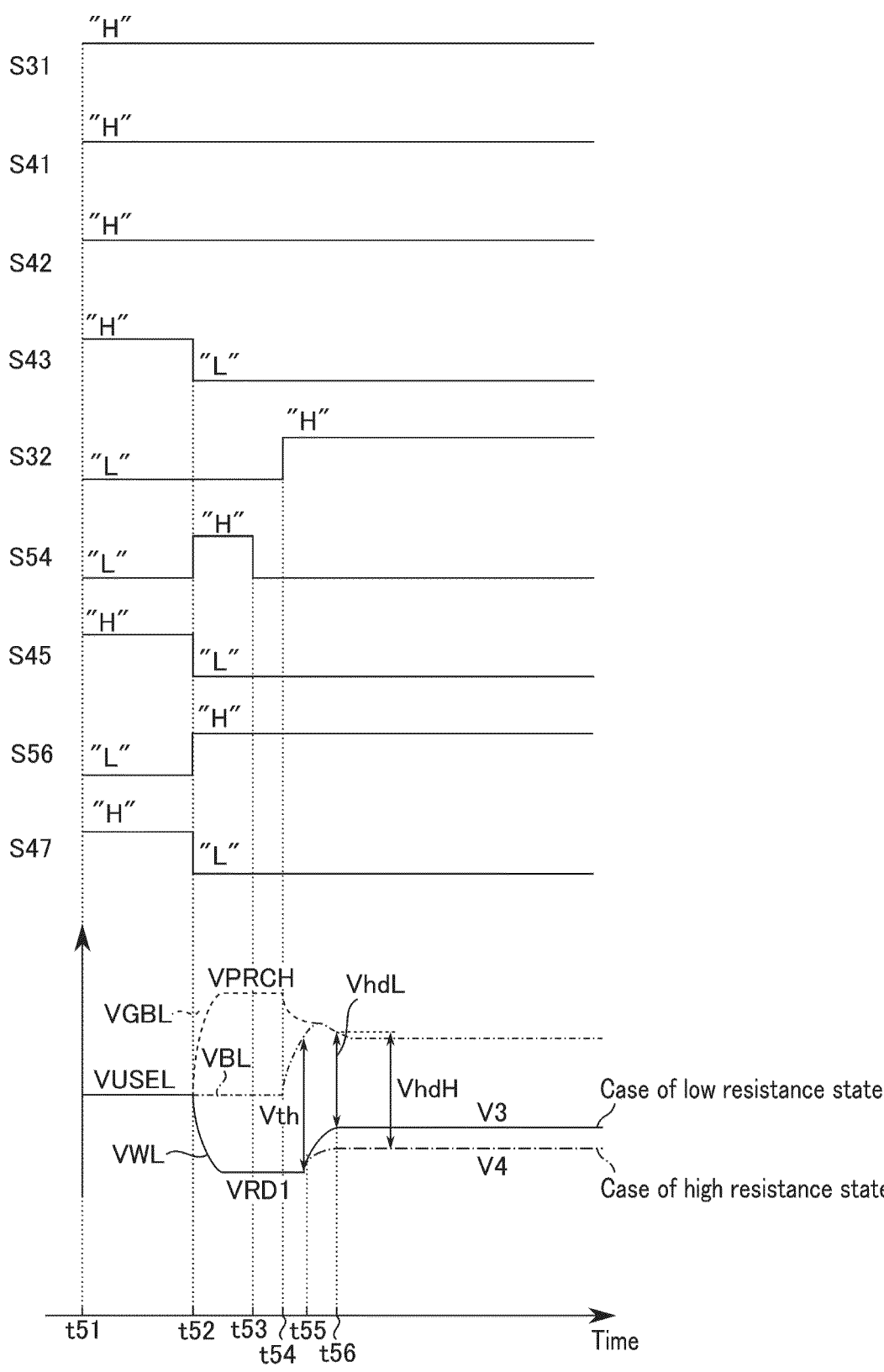
F I G. 29

MEMORY DEVICE

CROSS-REFERENCE TO RELATED APPLICATIONS

This application is based upon and claims the benefit of priority from Japanese Patent Applications No. 2023-103230, filed Jun. 23, 2023; and No. 2023-042075, filed Mar. 16, 2024, the entire contents of which are incorporated herein by reference.

FIELD

Embodiments described herein relate generally to a memory device.

BACKGROUND

A memory device using a magnetoresistive effect element is known.

BRIEF DESCRIPTION OF THE DRAWINGS

FIG. 2 is a circuit diagram of a memory cell array of the memory device in the first embodiment.

FIG. 3 is a perspective view of a part of the memory cell array of the memory device in the first embodiment.

FIG. 4 illustrates a cross section of an example of structure of a memory cell of the memory device in the first embodiment.

FIG. 5 illustrates an example of a curve of voltage and current characteristics of the memory cell of the memory device in the first embodiment.

FIG. 8 illustrates a state during the data reading of the memory device in the first embodiment.

FIG. 9 illustrates a state during the data reading of the memory device in the first embodiment.

FIG. 10 illustrates states of several signals during data reading of a memory device for reference along time.

FIG. 11 illustrates an example of components and coupling of the components of a read circuit of a memory device in a second embodiment.

FIG. 14 illustrates states of several signals during data reading of the memory device in the third embodiment along time.

FIG. 15 is a circuit diagram of a memory cell array in a fourth embodiment.

FIG. 16 is a perspective view of a part of a memory device in the fourth embodiment.

FIG. 17 illustrates an example of components and coupling of the components of a read circuit of the memory device in the fourth embodiment.

FIG. 18 illustrates states of several signals during data reading of the memory device in the fourth embodiment along time.

FIG. 19 illustrates functional blocks of a memory device in a fifth embodiment.

FIG. 20 illustrates functional blocks of a core circuit of the memory device in the fifth embodiment.

FIG. 21 illustrates components and coupling of the components of a selector of the memory device in the fifth embodiment.

FIG. 22 illustrates functional blocks of a sub-core circuit set of the memory device in the fifth embodiment.

FIG. 23 illustrates the components and coupling of the components of the selector of the memory device in the fifth embodiment.

FIG. 27 illustrates states of several signals during data reading of the memory device in the fifth embodiment along time.

FIG. 28 illustrates an example of components and coupling of the components of a read circuit of a memory device in a modification in the fifth embodiment.

FIG. 29 illustrates states of several signals during data reading of the memory device in the modification in the fifth embodiment.

DETAILED DESCRIPTION

Figure 1:
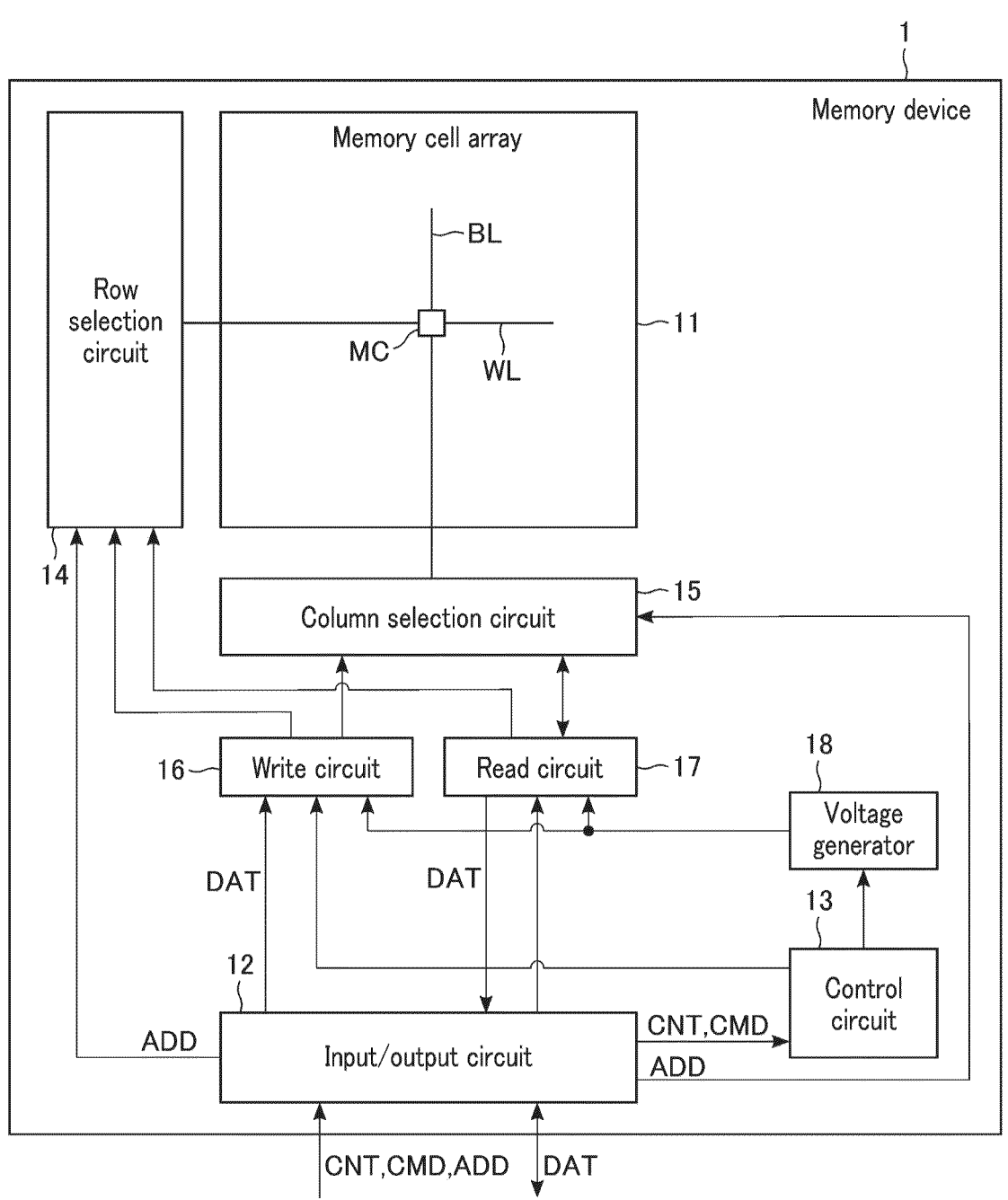
FIG. 1 illustrates functional blocks of a memory device in a first embodiment.

In general, according to one embodiment, a memory device includes a memory cell, a first interconnect, a first switch, a second interconnect, a second switch, a third interconnect, and a third switch. The memory cell includes a first end and a second end. The first interconnect is coupled to the first end. The first switch is coupled between the first interconnect and a first node that receives a first voltage. The second interconnect is coupled to the second end. The second switch includes a third end coupled to the second interconnect and a fourth end. The third interconnect is coupled to the fourth end. The third switch is coupled between the third interconnect and a second node that receives a second voltage different from the first voltage. A third voltage between the second voltage and the first voltage is applied to the first interconnect and the second interconnect. The third switch is turned off and the second switch is turned on after the third switch is turned on and after the application of the third voltage. The first switch is turned off after the application of the third voltage.

Embodiments will now be described with reference to the figures. In order to distinguish components having substantially the same function and configuration in an embodiment or over different embodiments from each other, an additional numeral or letter may be added to the end of each reference numeral or letter. The entire description of a particular embodiment applies to another embodiment unless an explicit mention is made otherwise, or an obvious elimination is involved.

The figures are schematic, and the relation between the thickness and the area of a plane of a layer and the ratio of thicknesses of layers may differ from those in actuality. The figures may include components which differ in relations and/or ratios of dimensions in different figures.

The specification and the claims, when mentioning that a particular (first) component is "coupled" to another (second) component, intend to cover both the form of the first component directly coupled to the second component and the form of the first component coupled to the second component via one or more components which are always or selectively conductive.

The embodiments will be described using an xyz orthogonal coordinate system. In the following description, the description "below" and words derived therefrom and words related thereto refer to locations of smaller coordinates on the z-axis, and the description "above" and words derived therefrom and words related thereto refer to locations of larger coordinates on the z-axis.

1. First Embodiment

1.1. Structure (Configuration)
1.1.1. Overall Structure

FIG. 1 illustrates functional blocks of a memory device in a first embodiment. A memory device 1 is a device that stores data. The memory device 1 stores data using a layer stack of magnetic bodies exhibiting variable resistance. As illustrated in FIG. 1, the memory device 1 includes a memory cell array 11, an input/output circuit 12, a control circuit 13, a row selection circuit 14, a column selection circuit 15, a write circuit 16, a read circuit 17, and a voltage generator 18.

The memory cell array 11 is a set of an arrayed memory cells MC. The memory cells MC can store data in a nonvolatile manner. A plurality of first interconnects and a plurality of second interconnects are located in the memory cell array 11. In the following description, one of the first interconnect and the second interconnect is referred to as word line WL and the other is referred to as bit line BL. The following description is based on an example in which the word line WL is associated with a row and the bit line BL is associated with a column. Each memory cell MC is coupled to one word line WL and one bit line BL. One memory cell MC is specified by selection of one row and selection of one column.

The input/output circuit 12 is a circuit that inputs and outputs data and signals. The input/output circuit 12 receives a control signal CNT, a command CMD, address information ADD, and data DAT from the outside of the memory device 1, for example, from a memory controller. The input/output circuit 12 outputs the data DAT.

The voltage generator 18 is a circuit that generates voltages of various magnitudes from voltages received from the outside of the memory device 1. The voltage generator 18 outputs one or more voltages of constant magnitude used for data reading. The voltage generator 18 outputs a voltage of constant magnitude and a voltage of variable magnitude used for data writing.

The write circuit 16 is a circuit that controls writing of data in the memory cell MC. The write circuit 16 receives the write data DAT from the input/output circuit 12 and receives the voltage for data writing from the voltage generator 18. The write circuit 16 outputs, based on control of the control circuit 13 and the write data DAT, a voltage and a current used for data writing.

The read circuit 17 is a circuit that controls reading of data from the memory cell MC. The read circuit 17 receives the voltage used for the data reading from the voltage generator 18. The read circuit 17 determines data stored in the memory cell MC using the voltage used for the data reading based on the control of the control circuit 13. The determined data is supplied to the input/output circuit 12 as read data DAT. The read circuit 17 includes a plurality of sense amplifier circuits SAC. The sense amplifier circuit SAC is a circuit that outputs, using a voltage based on data stored in a data read target memory cell MC, data determined as being stored in the data read target memory cell MC. Details of the sense amplifier circuit SAC is described below.

The row selection circuit 14 is a circuit that selects a row of the memory cell MC. The row selection circuit 14 receives the address information ADD from the input/output circuit 12. The row selection circuit 14 receives the voltage for data writing from the write circuit 16. The row selection circuit 14 receives the voltage for reading data from the read circuit 17. The row selection circuit 14 uses the voltage for data writing during data writing to select one or more word lines WL associated with a row specified by the received address information ADD. During data reading, the row selection circuit 14 uses the voltage for data reading to select one or more word lines WL associated with the row specified by the received address information ADD.

The column selection circuit 15 is a circuit that selects a column of the memory cell MC. The column selection circuit 15 receives the address information ADD from the input/output circuit 12. The column selection circuit 15 receives the voltage for data writing from the write circuit 16. The column selection circuit 15 receives the voltage for data reading from the read circuit 17. During data writing, the column selection circuit 15 uses the voltage for data writing to select one or more bit lines BL associated with a column specified by the received address information ADD. During data reading, the column selection circuit 15 uses the voltage for data reading to select the one or more bit lines BL associated with the column specified by the received address information ADD.

The control circuit 13 is a circuit that controls the operation of the memory device 1. The control circuit 13 receives the control signal CNT and the command CMD from the input/output circuit 12. The control circuit 13 controls the write circuit 16 and the read circuit 17 based on control instructed by the control signal CNT and the command CMD. Specifically, the control circuit 13 controls the write circuit 16 to supply the voltage received by the write circuit 16 from the voltage generator 18 to the row selection circuit 14 and the column selection circuit 15 during writing of data in the memory cell MC. The control circuit 13 controls the read circuit 17 to supply the voltage received by the read circuit 17 from the voltage generator 18 to the row selection circuit 14 and the column selection circuit 15 during reading of data from the memory cell MC.

1.1.2. Circuit Configuration of Memory Cell Array

FIG. 2 is a circuit diagram of a memory cell array of the memory device in the first embodiment. As illustrated in FIG. 2, M+1 word lines WL (WL_0, WL_1, . . . , WL_M) and N+1 bit lines BL (BL_0, BL_1, . . . , BL_N) are located in the memory cell array 11. M and N are positive integers.

Each memory cell MC is coupled to one word line WL and one bit line BL. Each memory cell MC includes one MTJ element MTJ and one switching element SE. In each memory cell MC, the MTJ element MTJ and the switching element SE are coupled in series. The switching element SE of each memory cell MC is coupled to one word line WL. The MTJ element MTJ of each memory cell MC is coupled to one bit line BL.

The MTJ element MTJ exhibits a tunnel magnetoresistive effect, and for example, is an element including a magnetic tunnel junction (MTJ). The MTJ element MTJ is also referred to a magnetoresistive effect element MTJ. The MTJ element MTJ is a variable resistance element that can switch between a low resistance state and a high resistance state. The MTJ element MTJ can store 1-bit data using a difference between the two resistance states. In one example, the MTJ element MTJ stores "0" data according to the low resistance state and "1" data according to the high resistance state.

The switching element SE is an element that has two terminals and performs electrical coupling or uncoupling between the two terminals. When a voltage applied between the two terminals in a first direction is lower than a certain threshold voltage, the switching element SE is in a high resistance state, for example, an electrically non-conductive state (OFF state). When the voltage applied between the two terminals rises to be equal to or higher than the threshold voltage, the switching element SE enters a low resistance state, for example, an electrically conductive state (ON state). When the voltage applied between the two terminals of the switching element SE in the low resistance state drops to be lower than the threshold voltage, the switching element SE enters the high resistance state. The switching element SE has, in a second direction opposite to the first direction, the same function as the function of switching between the high resistance state and the low resistance state based on the magnitude of the voltage applied in the first direction. That is, the switching element SE is a bidirectional switching element. By turning on or off the switching element SE, the presence or absence of supply of a current to the MTJ element MTJ coupled to the switching element SE, that is, selection or non-selection of the MTJ element MTJ can be controlled.

1.1.3. Structure of Memory Cell Array

FIG. 3 is a perspective view of a part of the memory cell array of the memory device in the first embodiment. As illustrated in FIG. 3, a plurality of conductors 21 and a plurality of conductors 22 are provided.

The conductors 21 have a linear shape and extends in a certain direction. The direction in which the conductors 21 extend is hereinafter referred to as x direction. The conductors 21 are disposed side by side in a direction intersecting or orthogonal to the x direction. The direction in which the conductors 21 are disposed side by side is hereinafter referred to as y direction. Each conductor 21 functions as one word line WL.

The conductors 22 are located in a layer different from a layer in which the conductors 21 are located. A direction from the conductors 21 toward the conductors 22 is hereinafter referred to as z direction. The conductors 22 have a linear shape, extend in the y direction, and are disposed side by side in the x direction. Each conductor 22 functions as one bit line BL.

One memory cell MC is provided at each of intersections of the conductors 21 and the conductors 22. The memory cells MC are arrayed in a matrix along an xy plane including the x direction and the y direction. Each memory cell MC includes a structure functioning as the switching element SE and a structure functioning as the MTJ element MTJ. Each of the structure functioning as the switching element SE and the structure functioning as the MTJ element MTJ includes one or more layers. For example, the structure functioning as the MTJ element MTJ is located on the upper surface of the structure functioning as the switching element SE. The lower surface of the memory cell MC is in contact with the upper surface of one conductor 21. The upper surface of the memory cell MC is in contact with the lower surface of one conductor 22.

1.1.4. Memory Cell

FIG. 4 illustrates a cross section of an example of the structure of the memory cell of the memory device in the first embodiment.

The switching element SE includes a variable resistance material 32. The variable resistance material 32 is a material exhibiting dynamically variable resistance, and has, for example, a layer shape. The variable resistance material 32 is a switching element between its two terminals where a first terminal of the two terminals is one of the upper surface and the lower surface of the variable resistance material 32, and a second terminal of the two terminals is the other of the upper surface and the lower surface of the variable resistance material 32. When a voltage applied between the two terminals is lower than a certain threshold voltage, the variable resistance material is in a "high resistance" state, for example, an electrically non-conductive state. When the voltage applied between the two terminals rises to be equal to or higher than the threshold voltage, the variable resistance material enters a "low resistance" state, for example, an electrically conductive state. When the voltage applied between the two terminals of the variable resistance material 32 in the low resistance state drops to be lower than the threshold voltage, the variable resistance material enters the high resistance state.

In one example, the variable resistance material 32 includes an insulator and a dopant introduced into the insulator by ion implantation. The insulator includes, for example, an oxide which may be $SiO_2$, or a material consisting substantially of $SiO_2$. In one example, the dopant includes arsenic (As) and germanium (Ge). The description "consisting (or formed) substantially of" and similar terms are meant to permit a component "consisting substantially of" something to contain unintended impurities.

The switching element SE can further include a lower electrode 31 and an upper electrode 33. FIG. 4 illustrates such an example. The variable resistance material 32 is located on the upper surface of the lower electrode 31, and the upper electrode 33 is located on the upper surface of the variable resistance material 32.

The MTJ element MTJ includes a ferromagnetic layer 35, an insulating layer 36, and a ferromagnetic layer 37. As an example, as illustrated in FIG. 4, the insulating layer 36 is located on the upper surface of the ferromagnetic layer 35, and the ferromagnetic layer 37 is located on the upper surface of the insulating layer 36.

The ferromagnetic layer 35 is a layer of a material exhibiting ferromagnetism. The ferromagnetic layer 35 has an axis of easy magnetization in a direction piercing through interfaces among the ferromagnetic layer 35, the insulating layer 36, and the ferromagnetic layer 37, and in one example, has an axis of easy magnetization at an angle of 45° or more and 90° or less with respect to the interfaces, and in one example, has an axis of easy magnetization in a direction orthogonal to the interfaces. A magnetization direction of the ferromagnetic layer 35 is intended to be unchanged even by reading and writing of data in the memory cell MC. The ferromagnetic layer 35 can function as a so-called reference layer. The ferromagnetic layer 35 may include a plurality of layers. Hereinafter, the ferromagnetic layer 35 may be referred to as reference layer RL.

The insulating layer 36 is a layer of an insulator. The insulating layer 36 includes or consists substantially of, for example, magnesium oxide (MgO) and functions as a so-called tunnel barrier (TB).

The ferromagnetic layer 37 is a layer of a material exhibiting ferromagnetism. The ferromagnetic layer 37 includes or consists substantially of, for example, cobalt iron boron (CoFeB) or iron boride (FeB). The ferromagnetic layer 37 has an axis of easy magnetization in a direction piercing through interfaces among the ferromagnetic layer 35, the insulating layer 36, and the ferromagnetic layer 37, and in one example, has an axis of easy magnetization at an angle of 45° or more and 90° or less with respect to the interfaces, and in one example, has an axis of easy magnetization in a direction orthogonal to the interfaces. A magnetization direction of the ferromagnetic layer 37 is variable by data writing to the memory cell MC, and the ferromagnetic layer 37 can function as a so-called storage layer (SL). Hereinafter, the ferromagnetic layer 37 may be referred to as storage layer SL.

When a magnetization direction of the storage layer SL is parallel to the magnetization direction of the reference layer RL, the MTJ element MTJ has certain low resistance. When the magnetization direction of the storage layer SL is antiparallel to the magnetization direction of the reference layer RL, the MTJ element MTJ has resistance higher than resistance in the case in which the magnetization direction of the storage layer SL and the magnetization direction of the reference layer RL are antiparallel.

When a current having magnitude equal to or larger than a current Icp having certain magnitude flows from the storage layer SL toward the reference layer RL, the magnetization direction of the storage layer SL becomes parallel to the magnetization direction of the reference layer RL. When a current having magnitude equal to or larger than a current Icap having certain magnitude flows from the reference layer RL toward the storage layer SL, the magnetization direction of the storage layer SL becomes antiparallel to the magnetization direction of the reference layer RL.

The MTJ element MTJ may include further layers.

FIG. 5 illustrates an example of curves of voltage and current characteristics of the memory cell of the memory device in the first embodiment. The horizontal axis of a graph indicates the magnitude of a terminal voltage (that is, a difference in potential between both ends) of the memory cell MC. The vertical axis of the graph indicates, in a logarithmic scale, the magnitude of a current flowing through the memory cell MC. In FIG. 5, virtual characteristics that do not actually appear are indicated by broken lines. FIG. 5 illustrates a case in which the memory cell MC is in the low resistance state and a case in which the memory cell MC is in the high resistance state.

When the voltage is increased from 0, the current keeps increasing until reaching a threshold voltage Vth. Until the voltage reaches the threshold voltage Vth, the switching element SE of the memory cell MC is off, that is, is non-conductive.

When the voltage is further increased and the voltage reaches the threshold voltage Vth, that is, reaches a point A, a relation between the voltage and the current shows a discontinuous change and shows characteristics shown at points B1 and B2. The magnitude of the current at the points B1 and B2 is greatly larger than the magnitude of the current at the point A. This rapid change in the current is based on the switching element SE of the memory cell MC being turned on. The magnitude of the current at the points B1 and B2 depends on a resistance state of the MTJ element MTJ of the memory cell MC.

When the voltage is reduced from the state in which the switching element SE is on, for example, a state in which voltage and the current indicate a relation shown at the point B1 or B2 and points having a higher voltage than the point B1 or B2, the current keeps decreasing.

When the voltage is further reduced and reaches a certain magnitude, the relation between the voltage and the current shows a discontinuous change. The voltage when the relation between the voltage and the current starts to show discontinuity depends on the terminal voltage of the MTJ element MTJ of the memory cell MC, that is, depends on whether the MTJ element MTJ is in the high resistance state or the low resistance state. When the MTJ element MTJ is in the low resistance state, the relation between the voltage and the current shows discontinuity from a point C1. When the MTJ element MTJ is in the high resistance state, the relation between the voltage and the current shows discontinuity from a point C2. When the voltage reaches the points C1 and C2, the relation between the voltage and the current shows characteristics shown at points D1 and D2. The magnitudes of the currents at the points D1 and D2 are respectively greatly smaller than the magnitudes of the currents at the points C1 and C2. This rapid change in the current is based on the switching element SE of the memory cell MC being turned off.

The terminal voltage at the point D1 of the memory cell MC including the MTJ element MTJ in the low resistance state is referred to as low hold voltage VhdL. The terminal voltage at the point D2 of the memory cell MC including the MTJ element MTJ in the high resistance state is referred to as high hold voltage VhdH.

1.1.5. Read Circuit

Figure 6:
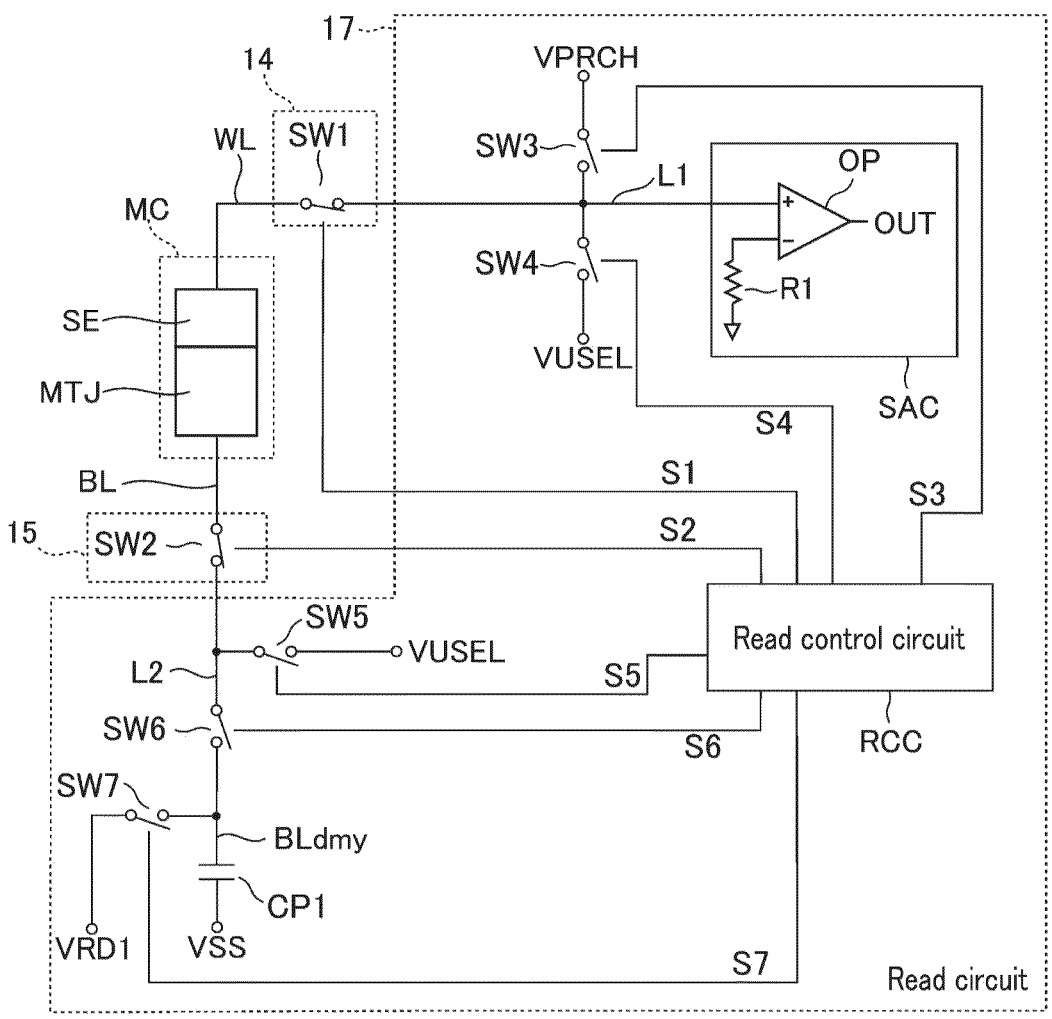
FIG. 6 illustrates an example of components and coupling of the components of a read circuit of the memory device in the first embodiment.

FIG. 6 illustrates an example of components and coupling of the components of the read circuit of the memory device in the first embodiment. FIG. 6 illustrates, as a representative, a state in which a certain memory cell MC is selected. That is, as described above with reference to FIG. 1, one word line WL is selected by the row selection circuit 14, and one bit line BL is selected by the column selection circuit 15. One memory cell MC coupled to one word line WL in the selected state and one bit line BL in the selected state is in a selected state, and data is read from the memory cell MC in the selected state. Then, the word line WL, the bit line BL, and the memory cell MC illustrated in FIG. 6 are in a selected state. Hereinafter, the word line WL in the selected state may be referred to as a selected word line WL. The bit line BL in the selected state may be referred to as a selected bit line BL. The memory cell MC in the selected state may be referred to as a selected memory cell MC.

As illustrated in FIG. 6, the read circuit 17 is coupled to the word line WL via the row selection circuit 14. The row selection circuit 14 includes a switch SW1.

In one example, the switch SW1 is a p-type or n-type metal oxide semiconductor field effect transistor (MOSFET). Alternatively, the switch SW1 is a p-type MOSFET and an n-type MOSFET that are coupled in parallel and receive signals of logic opposite to each other (or complementary) at respective gates of the MOSFETs. The switch SW1 receives the signal S1. While receiving the signal S1 at a high level or an "H" level, the switch SW1 is in an on state and maintains a state in which one end and the other end of the switch SW1 are electrically coupled. While receiving the signal S1 at a low level or an "L" level, the switch SW1 is in an off state and maintains a state in which one end and the other end of the switch SW1 are electrically uncoupled.

The same applies to a switch SWn and a signal Sn described below, where n is an integer of 2 or more. That is, a description in which the description about the switch SW1 is replaced with the switch SWn applies to the switch SWn, and a description in which the description about the signal S1 is replaced with the signal Sn applies to the signal Sn.

The read circuit 17 is also coupled to the bit line BL via the column selection circuit 15. The column selection circuit 15 includes a switch SW2.

The read circuit 17 includes a sense amplifier circuit SAC, switches SW3 to SW7, a capacitor CP1, interconnects L1 and L2, a dummy bit line BLdmy, and a read control circuit RCC.

The interconnect L1 is coupled to one end of the switch SW1. The switch SW1 is coupled to the word line WL at the other end.

The switch SW3 is coupled between a node that receives a pre-charge voltage VPRCH having constant magnitude and the interconnect L1. The node that receives the pre-charge voltage VPRCH functions as a node that supplies the pre-charge voltage VPRCH. In one example, the pre-charge voltage VPRCH is supplied from the voltage generator 18. The pre-charge voltage VPRCH is higher than a ground voltage VSS.

The switch SW4 is coupled between the interconnect L1 and a node that receives a non-selection voltage VUSEL having a certain magnitude. The node that receives the non-selection voltage VUSEL functions as a node that supplies the non-selection voltage VUSEL. In one example, the non-selection voltage VUSEL is supplied from the voltage generator 18. The non-selection voltage VUSEL has a magnitude between the magnitude of the ground voltage VSS and the magnitude of the pre-charge voltage VPRCH. In one example, the non-selection voltage VUSEL has half the magnitude of the pre-charge voltage VPRCH.

The sense amplifier circuit SAC outputs the data stored in a data-read-target selected memory cell MC based on the supplied voltage. In one example, the sense amplifier circuit SAC includes an operational amplifier OP and a resistor R1. A non-inverting input of the operational amplifier OP is coupled to the interconnect L1. An inverting input of the operational amplifier OP is coupled to one end of the resistor R1. The other end of the resistor R1 is coupled to a node of the ground voltage VSS. In one example, the inverting input of the operational amplifier OP has a potential having a magnitude between the magnitude of the high hold voltage VhdH and the magnitude of the low hold voltage VhdL. The resistor R1 has a magnitude that allows the inverting input of the operational amplifier OP to have such a potential.

The interconnect L2 is coupled to one end of the switch SW2. The switch SW2 is coupled to the bit line BL at the other end. A switch SW5 is coupled between the interconnect L2 and a node that receives the non-selection voltage VUSEL.

A switch SW6 is coupled between the interconnect L2 and the dummy bit line BLdmy. The capacitor CP1 is formed between the dummy bit line BLdmy and a node that receives the ground voltage VSS. The capacitor CP1 may be a capacitance element or a parasitic capacitor between the dummy bit line BLdmy and a node that receives the ground voltage VSS. The capacitance element includes an insulator between two conductors. The conductor may be a metal or a semiconductor into which impurities are introduced.

The switch SW7 is coupled between the dummy bit line BLdmy and a node that receives a read voltage RD1. The read voltage RD1 is lower than the non-selection voltage VUSEL. In one example, the read voltage RD1 is the ground voltage VSS.

The read control circuit RCC outputs signals S1 to S7.

1.2. Operation

Figure 7:
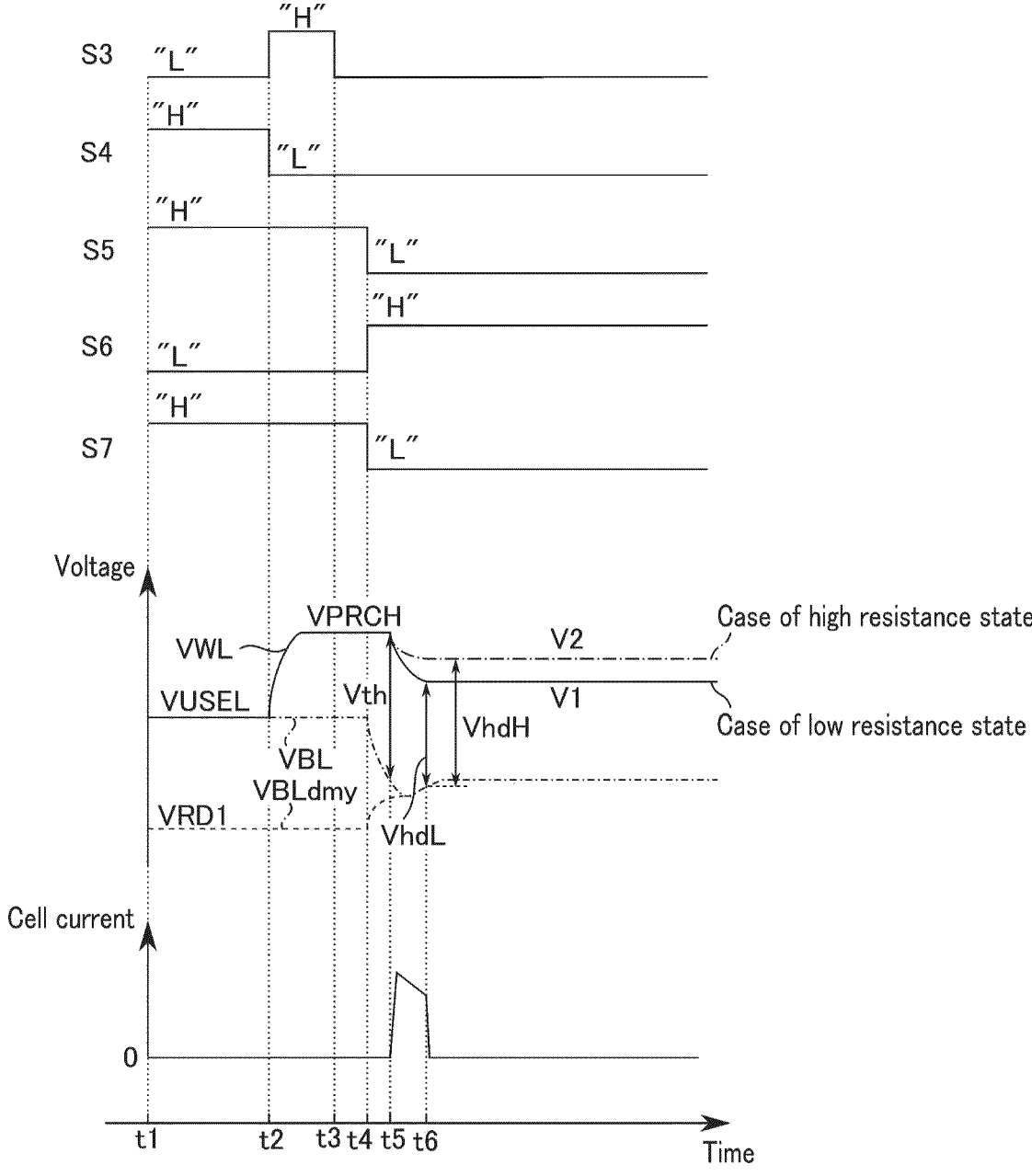
FIG. 7 illustrates states of several signals during data reading of the memory device in the first embodiment along time.

FIG. 7 illustrates states of several signals during data reading of the memory device in the first embodiment along time. FIG. 7 illustrates a state in which a certain data read target memory cell MC is selected as illustrated in FIG. 6. That is, both of the switches SW1 and SW2 coupled to the selected memory cell MC illustrated in FIG. 6 are on. The word line WL and the bit line BL illustrated in FIG. 6 are respectively a selected word line WL and a selected bit line BL. An operation in a period illustrated in FIG. 7 starts when data reading starts in a state in which the data read target memory cell MC is selected.

At time t1, each signal, the voltage of the node, and the current have the following states. The signals S3 and S6 have a low level, and the signals S4, S5, and S7 have a high level. For this reason, the switches SW3 to SW7 are in states described below. That is, the switches SW3 and SW6 are off, and the switches SW4, SW5, and SW7 are on.

Based on the switch SW3 being off and the switch SW4 being on, the selected word line WL receives the non-selection voltage VUSEL, and thus potential VWL of the selected word line WL (selected word line potential VWL) has a non-selection potential VUSEL. The non-selection potential VUSEL is a potential having a magnitude that an interconnect has when the non-selection voltage VUSEL is applied thereto, and in one example, has substantially the same magnitude as the magnitude of the non-selection voltage VUSEL. Based on the switch SW5 being on and the switch SW6 being off, the selected bit line BL receives the non-selection voltage VUSEL, and thus a potential VBL of the selected bit line BL (selected bit line potential VBL) has the non-selection potential VUSEL. Based on the switch SW6 being off and the switch SW7 being on, the dummy bit line BLdmy receives the read voltage VRD1, and thus a potential of the dummy bit line BLdmy (dummy bit line potential VBLdmy) has the read potential VRD1. The read potential VRD1 is a potential having magnitude that an interconnect has when the read voltage VRD1 is applied thereto, and in one example, has substantially the same magnitude as the read voltage VRD1.

At time t2, the signal S3 is set to the high level and the signal S4 is set to the low level. A state of components in the read circuit 17 at this time is illustrated in FIG. 8. As illustrated in FIG. 8, the switch SW3 is on and the switch SW4 is off. Therefore, the selected word line WL is coupled to the node that receives the pre-charge voltage VPRCH. Based on this, as illustrated in FIG. 7, the selected word line potential VWL rises from time t2 and reaches the pre-charge potential VPRCH. The pre-charge potential VPRCH is a potential having magnitude that an interconnect has when the pre-charge voltage VPRCH is applied thereto, and in one example, has substantially the same magnitude as the magnitude of the pre-charge voltage VPRCH.

At time t3, the signal S3 is set to the low level. Accordingly, the switch SW3 is turned off, and the selected word line WL electrically floats. The selected word line potential VWL remains at the pre-charge potential VPRCH even after time t3.

At time t4, the signal S5 is set to the low level, the signal S6 is set to the high level, and the signal S7 is set to the low level. A state of the components in the read circuit 17 at this time is illustrated in FIG. 9. As illustrated in FIG. 9, since the switch SW5 is off, the interconnect L2 does not receive the non-selection voltage VUSEL. Since the switch SW7 is off, the dummy bit line BLdmy does not receive the read voltage VRD1. Since the switch SW6 is on, the interconnect L2 and the dummy bit line BLdmy are coupled. Therefore, the selected bit line BL and the dummy bit line BLdmy are coupled to each other and are electrically floating. For this reason, charge sharing occurs between the selected bit line BL and the dummy bit line BLdmy. Based on this, as illustrated in FIG. 7, the selected bit line potential VBL drops and the dummy bit line potential VBLdmy rises. A change in potential due to the charge sharing is rapid, and thus the selected bit line potential VBL drops quickly.

At time t5, the difference between the selected word line potential VWL and the selected bit line potential VBL reaches the threshold voltage Vth. Accordingly, the switching element SE of the selected memory cell MC is turned on. Therefore, the selected word line WL is electrically coupled to the selected bit line BL via the switching element SE that is on in the selected memory cell MC. Accordingly, the selected word line WL discharges electricity. According to the electric discharge of the selected word line WL, a cell current flows from the selected word line WL toward the selected bit line BL.

The selected word line WL and the selected bit line BL are electrically floating. For this reason, the selected word line potential VWL drops with the lapse of time according to electric discharge caused because the cell current flows. Similarly, the selected bit line potential VBL rises with the lapse of time according to charging by the cell current. At this time, the selected word line potential VWL drops at different speed based on a state of the MTJ element MTJ of the selected memory cell MC. The selected word line potential VWL in the case in which the MTJ element MTJ of the selected memory cell MC is in the high resistance state more slowly drops than a drop of the selected word line potential VWL in the case in which the MTJ element MTJ of the selected memory cell MC is in the low resistance state.

At time t6, the selected word line potential VWL has a magnitude based on the resistance state of the MTJ element MTJ of the selected memory cell MC. That is, the difference between the selected word line potential VWL and the selected bit line potential VBL decreases because of the drop of the selected word line potential VWL and the rise of the selected bit line potential VBL. Accordingly, when the terminal voltage of the selected memory cell MC reaches a certain level, the switching element SE of the selected memory cell MC is turned off. As a result, the drop of the selected word line potential VWL and the rise of the selected bit line potential VBL stop, and the selected word line potential VWL and the selected bit line potential VBL have a certain magnitude. Specifically, this is as described below.

When the MTJ element MTJ of the selected memory cell MC is in the low resistance state, the switching element SE of the selected memory cell MC is turned off when the difference between the selected word line potential VWL and the selected bit line potential VBL becomes the low hold voltage VhdL. The rise of the selected bit line potential VBL stops, and the selected bit line potential VBL has a certain magnitude. According to the turn-off of the switching element SE of the selected memory cell MC, the drop of the selected word line potential VWL stops, and the selected word line potential VWL has a potential V1 having a certain magnitude.

On the other hand, when the MTJ element MTJ of the selected memory cell MC is in the high resistance state, when the difference between the selected word line potential VWL and the selected bit line potential VBL becomes the high hold voltage VhdH, the switching element SE of the selected memory cell MC is turned off. The rise of the selected bit line potential VBL stops, and the selected bit line potential VBL has a certain magnitude. According to the turn-off of the switching element SE of the selected memory cell MC, the drop of the selected word line potential VWL stops, and the selected word line potential VWL has a potential V2 having a certain magnitude. The potential V2 is higher than the potential V1.

Since the dummy bit line BLdmy is coupled to the selected bit line BL, the dummy bit line potential VBLdmy has the same magnitude as the selected bit line potential VBL.

At time t6, the cell current becomes zero based on the switching element SE of the selected memory cell MC being turned off.

After time t6, data determined based on the selected word line potential VWL as being stored in the selected memory cell MC is output from the sense amplifier circuit SAC. In one example, when the selected word line potential VWL is the potential V2, that is, when the difference between the selected word line potential VWL and the selected bit line potential VBL is the high hold voltage VhdH, the sense amplifier circuit SAC outputs a high-level signal. When the selected word line potential VWL is the potential V1, that is, when the difference between the selected word line potential VWL and the selected bit line potential VBL is the low hold voltage VhdL, the sense amplifier circuit SAC outputs a low-level signal.

1.3. Advantages (Advantageous Effects)

According to the first embodiment, as described below, it is possible to provide a memory device that can operate at high speed and suppress consumption of an extra current.

FIG. 10 illustrates a state of several signals during data reading of a memory device for reference. A read circuit 17*r* of a memory device 1*r* for reference is different from the read circuit 17 of the memory device 1 in the first embodiment in that the read circuit 17*r* does not include the capacitor CP1, the dummy bit line BLdmy, and the switch SW6 of the read circuit 17. FIG. 10 and the following description are based on an example in which the MTJ element MTJ of the selected memory cell MC is in a high resistance state. However, even in a case of the low resistance state, the same phenomenon occurs only a voltage referred to is different from a case of a high resistance state.

As illustrated in FIG. 10, the signal S7 is set to the high level at time t4. Accordingly, the switch SW7 is turned on, and selected bit line potential VBLr of the memory device 1*r* drops according to application of a voltage from a node that receives the read voltage VRD1. However, unlike the interconnect L1, large capacitance is added to the interconnect L2, and thus the selected bit line potential VBLr drops slowly. For this reason, a period from time t4 to time t11 at which the difference between selected word line potential VWLr and the selected bit line potential VBLr becomes the threshold voltage Vth is long, and eventually, a period to time t12 at which the difference between the selected word line potential VWLr and the selected bit line potential VBLr becomes the high hold voltage VhdH is long. This hinders high-speed data reading of the memory device 1*r*.

The following phenomenon can occur based on the selected bit line potential VBLr dropping slowly. First, at time t11, the difference between the selected word line potential VWLr and the selected bit line potential VBLr becomes the threshold voltage Vth, and the selected word line potential VWLr rapidly drops. At time t12, the difference between the selected word line potential VWLr and the selected bit line potential VBLr becomes the high hold voltage VhdH, and the switching element SE of the selected memory cell MC is turned off. Accordingly, the drop of the selected word line potential VWLr stops and, on the other hand, the drop of the selected bit line potential VBLr continues. For this reason, at time t13, the difference between the selected word line potential VWLr and the selected bit line potential VBLr becomes the threshold voltage Vth again. For this reason, the switching element SE of the selected memory cell MC is unintentionally turned on. Hereinafter, such an unintended turn-on of the switching element SE may be referred to as a re-turn-on. By the re-turn-on, a cell current flows unintentionally. This cell current increases a consumption current of the memory device 1r.

In order to avoid the re-turn-on, it is conceivable to turn off the switch SW7 and turn on the switch SW5 after time t11. Accordingly, the non-selection voltage VUSEL is applied to the selected bit line BLr, whereby the selected bit line potential VBLr rises. However, the control is complicated.

According to the first embodiment, the read circuit 17 includes the dummy bit line BLdmy that can be coupled to the interconnect L2 and can receive the read voltage VRD1. While the selected bit line BL is electrically floating, the selected bit line BL is coupled to the dummy bit line BLdmy having the read potential VRD1. Accordingly, the selected bit line potential VBL is dropped by charge sharing between the selected bit line BL and the dummy bit line BLdmy. In general, speed of a change in the potential of an interconnect due to charge sharing is higher than speed at which the potential of the interconnect changes according to application of a voltage from a circuit such as a voltage generator and a driver to the interconnect. For this reason, time t6 when the difference between the selected word line potential VWL and the selected bit line potential VBL becomes the high hold voltage VhdH or the low hold voltage VhdL in the memory device 1 in the first embodiment comes earlier than time t12 when the difference between the selected word line potential VWLr and the selected bit line potential VBLr becomes the high hold voltage VhdH or the low hold voltage VhdL in the memory device 1r. Therefore, the memory device 1 can read data at high speed.

Since the selected bit line potential VBL is dropped by charge sharing between the selected bit line BL and the dummy bit line BLdmy, when the switching element SE of the selected memory cell MC is turned off at time t5, the selected bit line potential VBL rises. Therefore, the re-turn-on of the switching element SE of the selected memory cell MC is avoided. For this reason, extra current consumption is avoided.

Since the selected bit line potential VBL is dropped by charge sharing between the selected bit line BL and the dummy bit line BLdmy, the selected bit line potential VBL rises from time t5 without operation from the outside. That is, for example, an operation of coupling the selected bit line BL to the node that receives the non-selection voltage VUSEL is unnecessary. Therefore, the re-turn-on can be easily suppressed.

1.4. Modification

It is not essential that the signal S7 remains at the high level from time t1 to time t4. The potential of the dummy bit line BLdmy may only has to become the read voltage VRD1 by time t4. Therefore, the signal S7 can be set to the low level at time t1 and set to the high level by time t4.

2. Second Embodiment

A second embodiment is different from the first embodiment in controlling a selected bit line potential VBL.

FIG. 11 illustrates an example of components and coupling of the components of a read circuit of a memory device in the second embodiment. Like the first embodiment, FIG. 11 illustrates, as a representative, a state in which certain one memory cell MC is selected as in FIG. 6.

A read circuit 17b of a memory device 1b in the second embodiment includes a switch SW8 in addition to the components included in the read circuit 17 of the memory device 1 in the first embodiment. The switch SW8 is coupled between the interconnect L2 and a node that receives the read voltage VRD1. The switch SW8 receives a signal S8. The signal S8 is supplied from a read control circuit RCCb.

Figure 12:
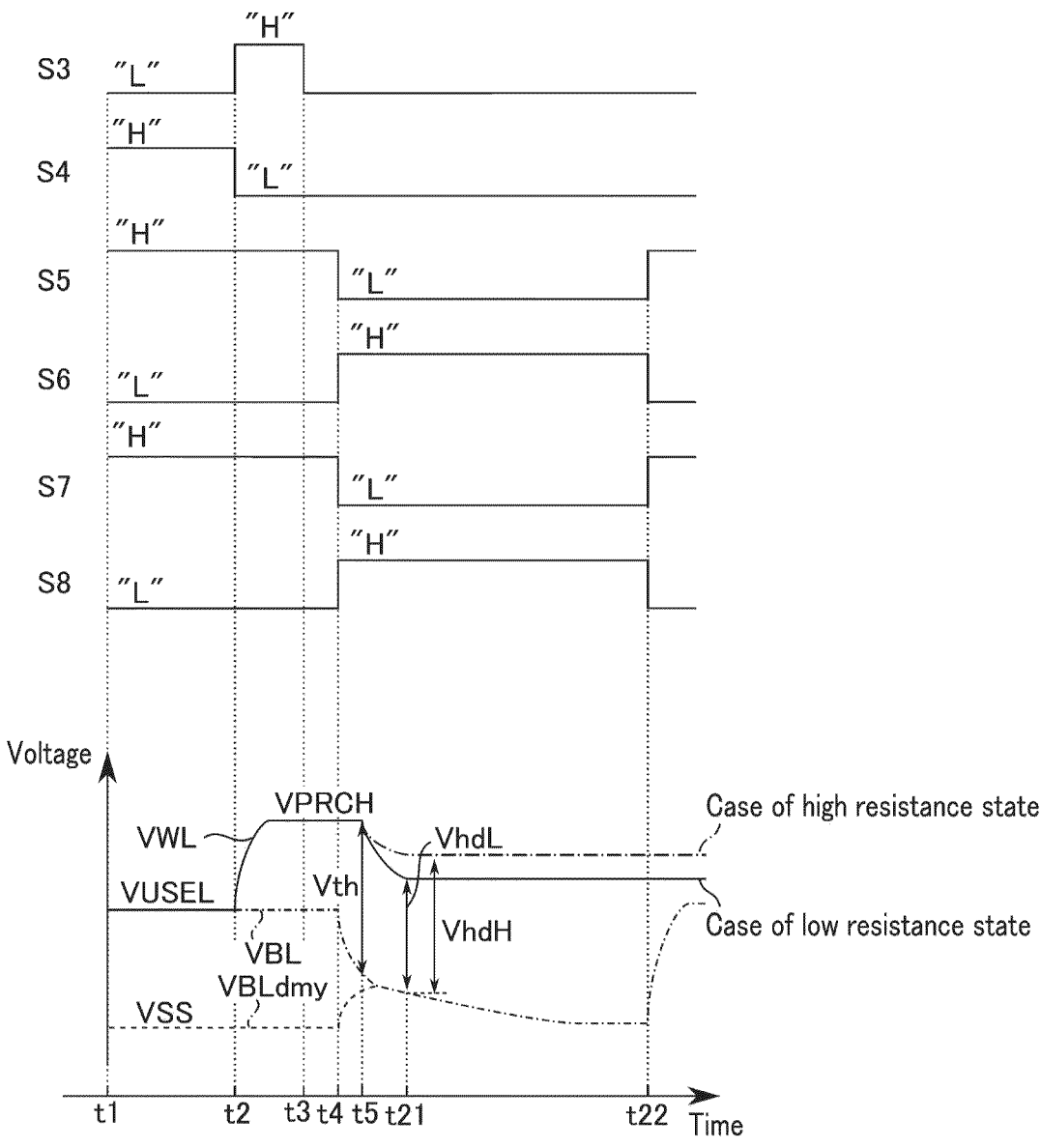
FIG. 12 illustrates states of several signals during data reading of the memory device in the second embodiment along time.

FIG. 12 illustrates states of several signals during data reading of the memory device in the second embodiment along time. FIG. 12 illustrates a state in which one read target memory cell MC is selected as illustrated in FIG. 11. That is, both of switches SW1 and SW2 coupled to the selected memory cell MC illustrated in FIG. 11 are on. A word line WL and a bit line BL illustrated in FIG. 11 are respectively a selected word line WL and a selected bit line BL. An operation in a period illustrated in FIG. 12 starts when data reading starts in a state in which a data read target memory cell MC is selected.

As illustrated in FIG. 12, the signal S8 has the same logic level as the signal S6. For this reason, from time t1 to time t4, the signal S8 has a low level. Therefore, the switch SW8 is off, and a selected bit line BL does not receive a read voltage VRD1.

At time t4, the signal S8 is set to a high level. Accordingly, the switch SW8 is turned on, and the selected bit line BL receives the read voltage VRD1. For this reason, even after the difference between a selected word line potential VWL and a selected bit line potential VBL reaches a threshold voltage Vth and a current starts to flow into the selected bit line BL via the selected memory cell MC at time t5, the selected bit line potential VBL drops. The difference between the selected word line potential VWL and the selected bit line potential VBL reaches the high hold voltage VhdH at time t21 in the case in which an MTJ element MTJ of the selected memory cell MC is in the high resistance state. The difference between the selected word line potential VWL and the selected bit line potential VBL reaches the low hold voltage VhdL at time t21 in the case in which the MTJ element MTJ of the selected memory cell MC is in the low resistance state.

At time t22, the signals S5 and S7 are set to the high level, and signals S6 and S8 are set to the low level. Accordingly, the selected bit line potential VBL becomes the non-selection potential VUSEL.

According to the second embodiment, as in the first embodiment, the read circuit 17b includes the dummy bit line BLdmy that can be coupled to a interconnect L2 and can receive the read voltage VRD1. While the selected bit line BL is electrically floating, the selected bit line BL is coupled to the dummy bit line BLdmy having the read potential VRD1. Therefore, the same advantages as those in the first embodiment can be obtained.

According to the second embodiment, the selected bit line BL receives the read voltage VRD1 simultaneously with a start of charge sharing. Therefore, the selected bit line potential VBL can be controlled to the read voltage VRD1. This enables the selected bit line potential VBL to be more stable regardless of a situation than when fluctuation in the selected bit line potential VBL is kept free by maintaining the selected bit line BL electrically floating.

3. Third Embodiment

A third embodiment is implemented additionally to the first embodiment and relates to control of a selected word line potential VWL.

Figure 13:
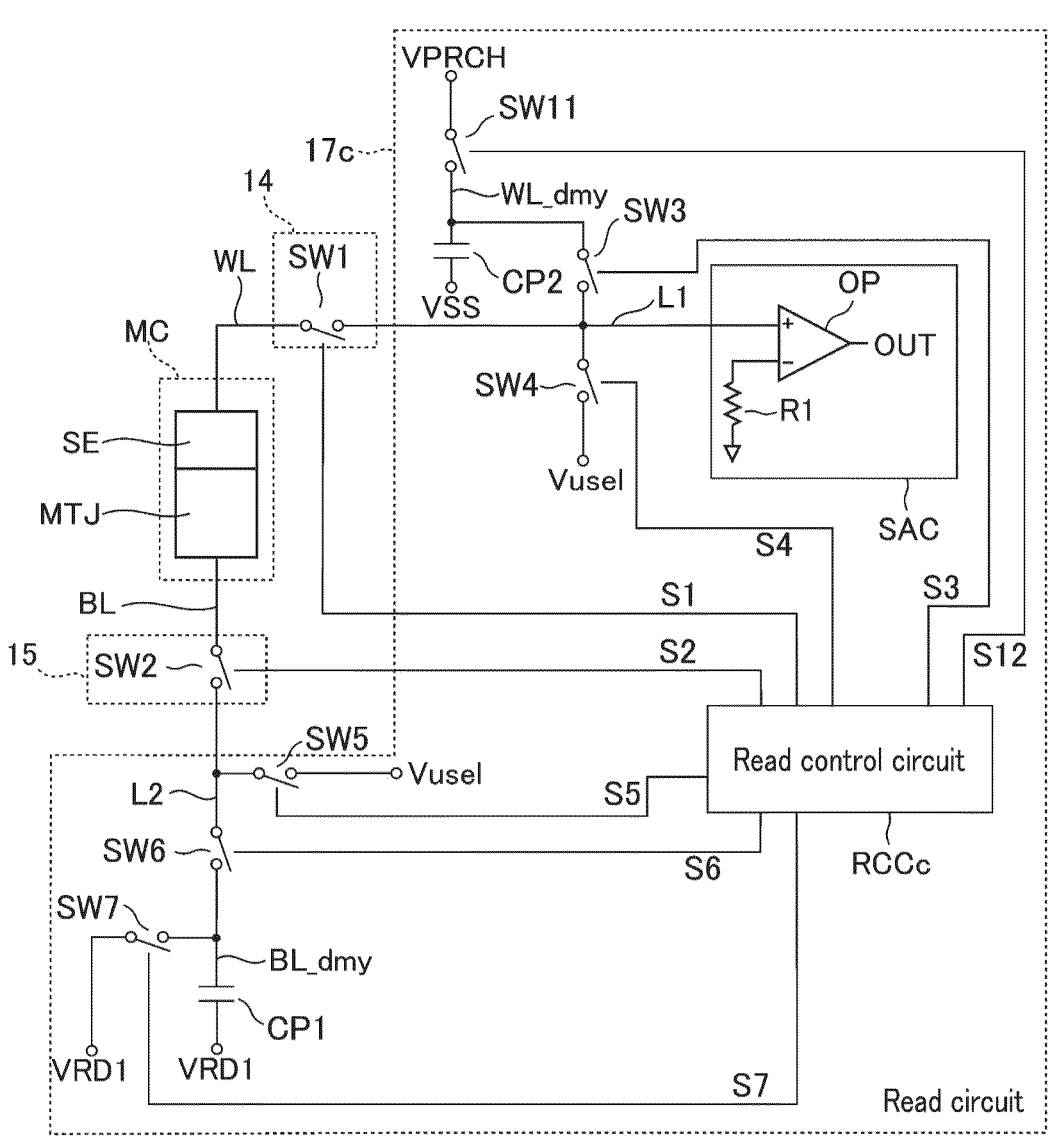
FIG. 13 illustrates an example of components and coupling of the components of a read circuit of a memory device in a third embodiment.

FIG. 13 illustrates an example of components and coupling of the components of a read circuit of a memory device according to the third embodiment. Like FIG. 6 in the first embodiment, FIG. 13 illustrates, as a representative, a state in which certain one memory cell MC is selected.

A read circuit 17c of a memory device 1c in the third embodiment includes a switch SW11, a capacitor CP2, and a dummy word line WLdmy in addition to the components included in the memory device 1 in the first embodiment. The switch SW3 is coupled to the dummy word line WLdmy instead of the node that receives the pre-charge voltage VPRCH in the first embodiment.

The switch SW11 is coupled between the node that receives the pre-charge voltage VPRCH and the dummy word line WLdmy. The switch SW11 receives a signal S11. The signal S11 is supplied from a read control circuit RCCc.

The capacitor CP2 is formed between the dummy word line WLdmy and a node of the ground voltage VSS. The capacitor CP2 may be a capacitance element or may be a parasitic capacitor between dummy word line WLdmy and the node that receives the ground voltage VSS.

FIG. 14 illustrates states of several signals during data reading of the memory device in the third embodiment along time. FIG. 14 illustrates a state in which one read target memory cell MC is selected as illustrated in FIG. 13. That is, both of the switches SW1 and SW2 coupled to the selected memory cell MC illustrated in FIG. 13 are on. A word line WL and a bit line BL illustrated in FIG. 14 are respectively a selected word line WL and a selected bit line BL. An operation in a period illustrated in FIG. 14 starts when data reading starts in a state in which a data read target memory cell MC is selected.

As illustrated in FIG. 14, at time t1, the signal S11 has a high level. For this reason, the dummy word line WLdmy is coupled to the node that receives the pre-charge voltage VPRCH. The dummy word line WLdmy has the pre-charge potential VPRCH.

At time t2, the signal S11 is set to a low level and the signal S3 is set to the high level. For this reason, charge sharing occurs between the interconnect L1 and the dummy word line WLdmy. Therefore, the potential of the interconnect L1 quickly rises to the pre-charge potential VPRCH from time t2.

According to the third embodiment, as in the first embodiment, the read circuit 17c includes the dummy bit line BLdmy that can be coupled to the interconnect L2 and can receive the read voltage VRD1. While the selected bit line BL is electrically floating, the selected bit line BL is coupled to the dummy bit line BLdmy having the read potential VRD1. Therefore, the same advantages as those in the first embodiment can be obtained.

According to the third embodiment, the read circuit 17c includes the dummy word line WLdmy that can be coupled to the interconnect L1 and can receive the pre-charge voltage VPRCH. The selected word line WL and the dummy word line WLdmy are coupled when the selected word line WL is pre-charged. Accordingly, the selected word line WL can be quickly pre-charged.

The third embodiment may be combined with the second embodiment.

4. Fourth Embodiment

A fourth embodiment is applied to the first to third embodiments and is different from the first to third embodiments in the structure of an array of memory cells and points related the structure.

4.1. Configuration

FIG. 15 is a circuit diagram of a memory cell array 11 according to the fourth embodiment. As illustrated in FIG. 15, M+1 word lines WLA (WLA_0, WLA_1, ..., WLA_M) and M+1 word lines WLB (WLB_0, WLB_1, ..., WLB_M) are located in the memory cell array 11. N+1 bit lines BL (BL_0, BL_1, ..., BL_N) are also located in the memory cell array 11.

Each memory cell MCA is coupled to one bit line BL and one word line WLA. That is, one memory cell MCA is coupled between each bit line BL and one word line WLA. Each memory cell MCA includes one MTJ element MTJA and one switching element SEA. In each memory cell MCA, one MTJ element MTJA and one switching element SEA are coupled in series. Each MTJ element MTJA is coupled to one bit line BL. Each switching element SEA is coupled to one word line WLA.

Similarly, each memory cell MCB is coupled to one bit line BL and one word line WLB. That is, one memory cell MCB is coupled between each bit line BL and one word line WLB. Each memory cell MCB includes one MTJ element MTJB and one switching element SEB. In each memory cell MCB, one MTJ element MTJB and one switching element SEB are coupled in series. Each MTJ element MTJB is coupled to one bit line BL. Each switching element SEB is coupled to one word line WLB.

FIG. 16 is a perspective view of a part of a memory device in the fourth embodiment. As illustrated in FIG. 16, the memory cell array 11 includes a conductor 23 and memory cells MCB in addition to the structure illustrated in FIG. 3 in the first embodiment. A memory cell MC between a conductor 21 and a conductor 22 functions as a memory cell MCA. An MTJ element MTJ of the memory cell MCA functions as an MTJ element MTJA. A switching element SE of the memory cell MCA functions as a switching element SEA.

Conductors 23 have a linear shape, extend in the x direction, and are disposed side by side in the y direction. Each conductor 23 functions as one word line WLB. The conductor 23 is located in the z direction from the conductor 22.

One memory cell MCB is provided at each of intersections of the conductors 23 and conductors 22. Memory cells MCB are arrayed in a matrix along the xy plane. Each memory cell MCB includes a structure functioning as the switching element SEB and a structure functioning as the MTJ element MTJB. Each of the structure functioning as the switching element SEB and the structure functioning as the MTJ element MTJB includes one or more layers. For example, the structure functioning as the MTJ element MTJB is located on the upper surface of the structure functioning as the switching element SEB. The lower surface of the memory cell MCB is in contact with the upper surface of one conductor 23. The upper surface of the memory cell MCB is in contact with the lower surface of one conductor 22.

FIG. 17 illustrates an example of components and coupling of the components of a read circuit of the memory device in the fourth embodiment. Like FIG. 6 in the first embodiment, FIG. 17 illustrates, as a representative, a state in which certain one memory cell MCB is selected.

A read circuit 17d of a memory device 1d in the fourth embodiment further includes a sense amplifier circuit SAC2 and switches SW23 and SW27 in addition to the components included in the read circuit 17 in the first embodiment as illustrated in FIG. 6.

Among the components in the read circuit 17d, the components illustrated in FIG. 6 are used to read data from the memory cell MCA. That is, in the fourth embodiment, the memory cell MC and the word line WL described above with reference to FIG. 6 in the first embodiment are respectively the memory cell MCA and the word line WLA.

On the other hand, the components illustrated in FIG. 17 are used to read data from the memory cell MCB. The memory cell MCB and the word line WLB illustrated in FIG. 17 are respectively the memory cell MCB and the word line WLB.

As illustrated in FIG. 17, the read circuit 17d is coupled to the word line WLB via the row selection circuit 14.

The switch SW23 is coupled between a node that receives the read voltage VRD1 and a interconnect L1.

Like the sense amplifier circuit SAC in the first embodiment, the sense amplifier circuit SAC2 includes an operational amplifier OP and, on the other hand, includes a resistor R2 instead of the resistor R1 in the sense amplifier circuit SAC. The sense amplifier circuit SAC2 is coupled to the interconnect L1 at the non-inverting input of the operational amplifier OP.

The switch SW27 is coupled between a dummy bit line BLdmy and a node that receives the pre-charge voltage VPRCH.

A read control circuit RCCd outputs signals S23 and S27 in addition to the function of the read control circuit RCC in the first embodiment.

4.2. Operation

An overview of the data reading from the memory cell MCB is the same as the overview of the data reading from the memory cell MCA, that is, the operation described above with reference to FIG. 7 in the first embodiment except for inversion of the potentials of the word line WL and the bit line BL.

FIG. 18 illustrates states of several signals during data reading of the memory device in the fourth embodiment along time. FIG. 18 illustrates a state in which one data read target memory cell MCB is selected as illustrated in FIG. 17. That is, both of the switches SW1 and SW2 coupled to the selected memory cell MCB illustrated in FIG. 6 are on. The word line WLB and the bit line BL illustrated in FIG. 17 are respectively a selected word line WLB and a selected bit line BL. An operation in a period illustrated in FIG. 18 starts when data reading starts in a state in which the data read target memory cell MCB is selected.

The changes in the levels of the signals S23, S4, S5, S6, and S27 are the same as the changes in the levels of the signals S3, S4, S5, S6, and S7 in the first embodiment illustrated in FIG. 7, respectively.

At time t31, the signal S23 is at a low level and the signal S4 is at a high level. For this reason, the switch SW23 is off and the switch SW4 is on. Therefore, the selected word line WLB receives the non-selection voltage VUSEL, and thus a potential VWLB of the selected word line WLB (selected word line potential VWLB) has the non-selection potential VUSEL.

The signal S5 is at the high level and the signal S6 is at the low level. Therefore, the switch SW5 is on and the switch SW6 is off. Therefore, the selected bit line BL has the non-selection potential VUSEL.

The switch SW27 is on based on the signal S27 being at the high level. Therefore, the dummy bit line BLdmy receives the pre-charge voltage VPRCH, and thus a dummy bit line potential VBLdmy has the pre-charge potential VPRCH.

At time t32, the signal S23 is set to the high level and the signal S4 is set to the low level. For this reason, the switch SW23 is turned on and the switch SW4 is turned off. Therefore, the selected word line WLB is coupled to a node that receives the read voltage VRD1. Based on this, from time t32, the selected word line potential VWLB drops and reaches the read potential VRD1.

At time t33, the signal S23 is set to the low level. For this reason, the switch SW23 is turned off and the selected word line WLB electrically floats. The selected word line potential VWLB remains at the read potential VRD1 even after time t33.

At time t34, the signal S5 is set to the low level, the signal S6 is set to the high level, and the signal S27 is set to the low level. For this reason, the switch SW5 is turned off, the switch SW6 is turned on, and the switch SW27 is turned off. Since the switch SW5 is turned off, the interconnect L2 does not receive the non-selection voltage VUSEL. Since the switch SW27 is turned off, the dummy bit line BLdmy does not receive the pre-charge voltage VPRCH. Since the switch SW6 is turned on, whereby the interconnect L2 and the dummy bit line BLdmy are coupled. Therefore, the selected bit line BL and the dummy bit line BLdmy are coupled to each other and are electrically floating. For this reason, charge sharing occurs between the selected bit line BL and the dummy bit line BLdmy. Based on this, as illustrated in FIG. 18, the selected bit line potential VBL rises and the dummy bit line potential VBLdmy drops.

At time t35, the difference between the selected word line potential VWLB and the selected bit line potential VBL reaches the threshold voltage Vth. For this reason, the switching element SEB of the selected memory cell MCB is turned on and the selected word line WLB is charged. According to the charging of the selected word line WLB, a cell current flows from the selected bit line BL to the selected word line WLB.

The selected word line WLB and the selected bit line BL are electrically floating. For this reason, the selected word line potential VWLB rises with the lapse of time according to the charging by the flow of the cell current. Similarly, the selected bit line potential VBL drops with the lapse of time according to discharge by the cell current. At this time, the selected word line potential VWLB in the case in which the MTJ element MTJB of the selected memory cell MCB is in the high resistance state rises more slowly than the rise of the selected word line potential VWLB in the case in which the MTJ element MTJB of the selected memory cell MCB is in the low resistance state.

At time t36, when the MTJ element MTJB of the selected memory cell MCB is in the low resistance state, the switching element SEB of the selected memory cell MCB is turned off when the difference between the selected word line potential VWLB and the selected bit line potential VBL becomes the low hold voltage VhdL. For this reason, the drop of the selected bit line potential VBL stops and the rise of the selected word line potential VWLB stops. As a result, the selected word line potential VWLB has a potential V3 having a certain magnitude.

On the other hand, in the case in which the MTJ element MTJB of the selected memory cell MCB is in the high resistance state, the switching element SEB of the selected memory cell MCB is turned off when the difference between the selected word line potential VWLB and the selected bit line potential VBL becomes the high hold voltage VhdH. For this reason, the drop of the selected bit line potential VBL stops and the rise of the selected word line potential VWLB stops. As a result, the selected word line potential VWLB has a potential V4 having a certain magnitude. The potential V4 is lower than the potential V3.

Since the dummy bit line BLdmy is coupled to the selected bit line BL, the dummy bit line potential VBLdmy has the same magnitude as the selected bit line potential VBL.

At time t36, the cell current becomes zero based on the switching element SEB of the selected memory cell MCB being turned off.

After time t36, data determined based on the selected word line potential VWLB as being stored in the selected memory cell MCB is output from the sense amplifier circuit SAC2.

4.3. Advantages

According to the fourth embodiment, as in the first embodiment, the read circuit 17d includes the dummy bit line BLdmy that can be coupled to the interconnect L2 and can receive the read voltage VRD1. While the selected bit line BL is electrically floating, the selected bit line BL is coupled to the dummy bit line BLdmy having the read potential VRD1. Therefore, the same advantages as those in the first embodiment can be obtained.

According to the fourth embodiment, the read circuit 17d includes the dummy bit line BLdmy that can be coupled to the interconnect L2 and can receive the pre-charge voltage VPRCH. While the selected bit line BL is electrically floating, the selected bit line BL is coupled to the dummy bit line BLdmy having the pre-charge potential VPRCH. For this reason, the selected bit line potential VBL is raised by charge sharing between the selected bit line BL and the dummy bit line BLdmy. For this reason, even when a relation between the magnitudes of the word line potential VWL and the bit line potential VBL is opposite to the relation in the first embodiment, data can be read at high speed by the same mechanism as the mechanism described above in the first embodiment.

4.4. Modification

The fourth embodiment may further include a component equivalent to the component for reading data from the memory cell MCA in the second embodiment. That is, the components for reading data from the memory cell MCB illustrated in FIG. 17 further includes a switch SW28 coupled to the interconnect L2. The switch SW28 is equivalent to the switch SW8 in the second embodiment relating to the data reading from the memory cell MCA. On the other hand, in the case of data reading from the memory cell MCB, since the interconnect L2 is controlled to the pre-charge voltage VPRCH, the interconnect L2 is coupled to a node that receives the pre-charge voltage VPRCH via the switch SW28.

The fourth embodiment may further include a component equivalent to the component for the data reading from the memory cell MCA in the third embodiment. That is, the switch SW23 is coupled to the dummy word line WLdmy instead of the node that receives the read voltage VRD1. The dummy word line WLdmy is coupled to the node that receives the read voltage VRD1 via a switch equivalent to the switch SW11. A capacitor equivalent to the capacitor CP2 is formed between the dummy word line WLdmy and the node that receives the ground voltage VSS.

5. Fifth Embodiment

A fifth embodiment is based on the first embodiment and relates to a more specific form of the first embodiment.

5.1. Structure

5.1.1. Overall Configuration

FIG. 19 illustrates functional blocks of a memory device according to the fifth embodiment. A memory device 1e in the fifth embodiment includes a core circuit 41, an input/output circuit 12, a control circuit 13e, a decode circuit 42, a page buffer 43, and a voltage generator 18.

The core circuit 41 is a circuit including a plurality of memory cells MC and interconnects and circuits for accessing the memory cells MC.

The control circuit 13e receives a command CMD and a control signal CNT from the input/output circuit 12. The control circuit 13e controls the core circuit 41 based on control instructed by the command CMD and the control signal CNT and controls reading of data from the memory cell MC and writing of data in the memory cell MC. The control circuit 13e controls the voltage generator 18 based on the control instructed by the command CMD and the control signal CNT.

The decode circuit 42 is a circuit that decodes address information ADD. The decode circuit 42 receives the address information ADD from the input/output circuit 12. The decode circuit 42 decodes the address information ADD and generates, based on a result of the decoding, a signal for selecting a data read or data write target memory cell MC. The generated signal is transmitted to the core circuit 41.

The page buffer 43 is a circuit that temporarily stores data having a certain size. The page buffer 43 receives data DAT to be written in the memory cell MC from the input/output circuit 12, temporarily stores the data, and transfers the data to the core circuit 41. The page buffer 43 receives data read from the memory cell MC, temporarily stores the read data, and transfers the data DAT to the input/output circuit 12.

The voltage generator 18 supplies voltages used for data writing to the core circuit 41 during the data writing in the memory cell MC. The voltage generator 18 supplies voltages used for data reading to the core circuit 41 during the data reading from the memory cell MC.

5.1.2. Configuration of Core Circuit

FIG. 20 illustrates functional blocks of the core circuit of the memory device in the fifth embodiment. As illustrated in FIG. 20, the core circuit 41 includes a plurality of sub-core circuit sets FCSC, a plurality of interconnects FWL (FWL_0, FWL_1, . . . ), a plurality of interconnects FBL (FBL_0, FBL_1, . . . ), an FWL selector FWS, an FBL selector FBS, an interconnect EWL, an interconnect EBL, and a read circuit 45.

Each sub-core circuit set FCSC is a set of a plurality of components and includes a plurality of memory cells MC, a plurality of selectors, and a plurality of interconnects. Each sub-core circuit set FCSC is coupled to one interconnect FWL and one interconnect FBL.

Each interconnect FWL is coupled to a plurality of sub-core circuit sets FCSC. Each interconnect FBL is coupled to a plurality of sub-core circuit sets FCSC.

Each FWL selector FWS is a circuit that selects one of the plurality of interconnects FWL. Each FWL selector FWS receives the address information ADD and couples one interconnect FWL specified by the received address information ADD among the plurality of interconnects FWL to the interconnect EWL.

Each FBL selector FBS is a circuit that selects one of the plurality of interconnects FBL. Each FBL selector FBS receives the address information ADD and couples one interconnect FBL specified by the received address information ADD among the plurality of interconnects FBL to the interconnect EBL.

The read circuit 45 is coupled to the interconnects EWL and EBL.

FIG. 21 illustrates components and coupling of the components of the FWL selector and the FBL selector of the memory device in the fifth embodiment. As illustrated in FIG. 21, the FWL selector FWS includes switches FWSW as many as the sub-core circuit sets FCSC coupled to each interconnect FBL. Each switch FWSW is coupled to one interconnect FWL at one end and is coupled to the interconnect EWL at the other end. Each switch FWSW is p-type or n-type MOSFET or p-type and n-type MOSFETs that are coupled in parallel and receive complementary signals at respective gates of the switches FWSW. Each switch FWSW is turned on or off by control of the read circuit 45 based on the address information ADD. The description about the switch FWSW also applies to switches FBSW, GWSW, GBSW, WSW, and BSW included in the core circuit 41 to be described below.

The FBL selector FBS includes switches FBSW as many as the sub-core circuit sets FCSC coupled to each interconnect FWL. Each switch FBSW is coupled to one interconnect FBL at one end and is coupled to the interconnect EBL at the other end.

FIG. 22 illustrates functional blocks of the sub-core circuit set of the memory device in the fifth embodiment. As illustrated in FIG. 22, each sub-core circuit set FCSC includes a plurality of sub-core circuits SCC, a plurality of global word lines GWL (GWL_0, GWL_1, . . . ), a plurality of global bit lines GBL (GBL_0, GBL_1, . . . ), a GWL selector GWS, a GBL selector GBS, an interconnect FWL, and an interconnect FBL.

Each sub-core circuit SCC is a set of a plurality of components and includes a plurality of memory cells MC, a plurality of selectors, and a plurality of interconnects. Each sub-core circuit SCC is coupled to one global word line GWL and one global bit line GBL.

Each global word line GWL is coupled to a plurality of sub-core circuits SCC. Each global bit line GBL is coupled to a plurality of sub-core circuits SCC.

Each GWL selector GWS is a circuit that selects one of the plurality of global word lines GWL. Each GWL selector GWS receives the address information ADD and couples one global word line GWL specified by the received address information ADD among the plurality of global word lines GWL to one interconnect FWL.

Each GBL selector GBS is a circuit that selects one of the plurality of global bit lines GBL. Each GBL selector GBS receives the address information ADD and couples one global bit line GBL specified by the received address information ADD among the plurality of global bit lines GBL to one interconnect FBL.

FIG. 23 illustrates components and coupling of the components of the GWL selector and the GBL selector of the memory device in the fifth embodiment. As illustrated in FIG. 23, the GWL selector GWS includes switches GWSW as many as the sub-core circuits SCC coupled to each global bit line GBL. Each switch GWSW is coupled to one global word line GWL at one end and is coupled to one interconnect FWL at the other end. Each switch GWSW is turned on or off by control of the read circuit 45 based on the address information ADD.

The GBL selector GBS includes switches GBSW as many as the sub-core circuits SCC coupled to each global word line GWL. Each switch GBSW is coupled to one global bit line GBL at one end and is coupled to the interconnect FBL at the other end. Each switch GBSW is turned on or off by control of the read circuit 45 based on the address information ADD.

Figure 24:
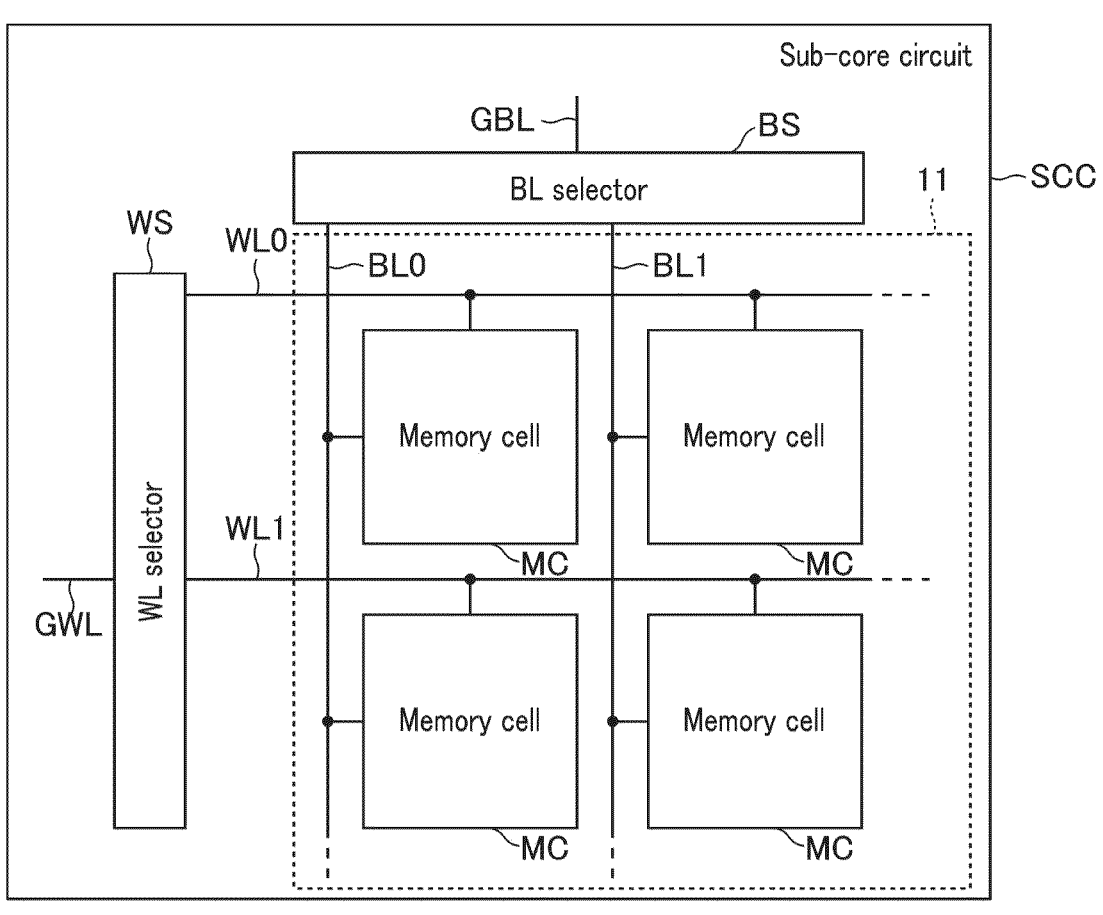
FIG. 24 illustrates the functional blocks of the sub-core circuit of the memory device in the fifth embodiment.

FIG. 24 illustrates functional blocks of the sub-core circuit of the memory device in the fifth embodiment. As illustrated in FIG. 24, each sub-core circuit SCC includes a plurality of memory cells MC, a plurality of word lines WL (WL_0, WL_1, . . . ), a plurality of bit lines BL (BL_0, BL_1, . . . ), a WL selector WS, a BL selector BS, a global word line GWL, and a global bit line GBL.

Each memory cell MC is coupled to one word line WL and one bit line BL. Each word line WL is coupled to a plurality of memory cells MC. Each bit line BL is coupled to a plurality of memory cells MC. The array of the memory cells MC, the word lines WL, and the bit lines BL can be realized by the structure illustrated in FIG. 3 in the first embodiment.

Each WL selector WS is a circuit that selects one of the plurality of word lines WL. Each WL selector WS receives the address information ADD and couples one word line WL specified by the received address information ADD among the plurality of word lines WL to one global word line GWL.

Each BL selector BS is a circuit that selects one of the plurality of bit lines BL. Each BL selector BS receives the address information ADD and couples one bit line BL specified by the received address information ADD among the plurality of bit lines BL to one global bit line GBL.

Figure 25:
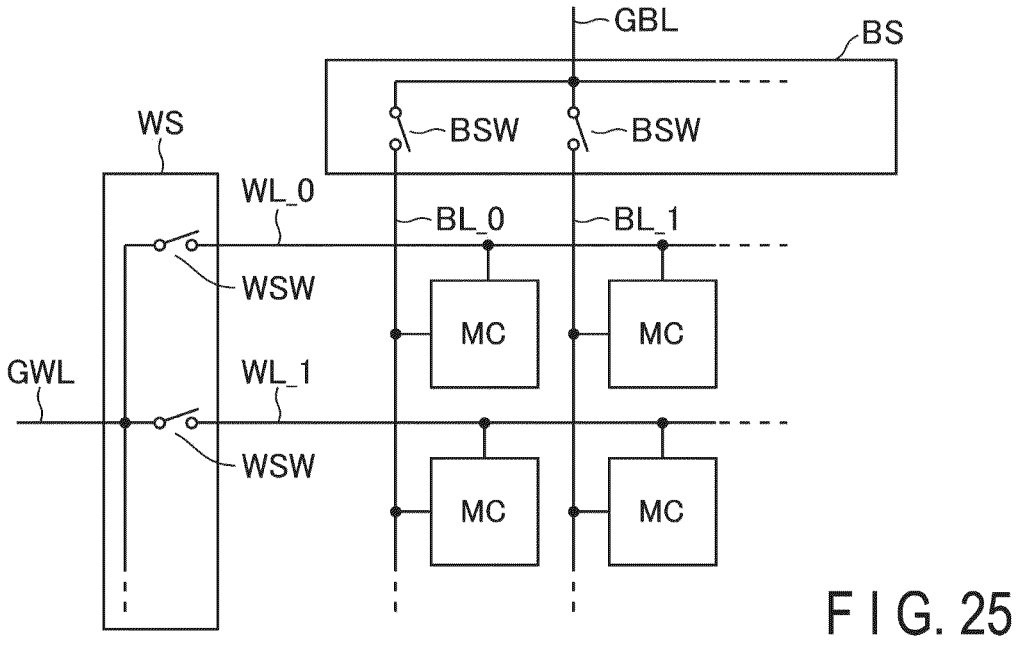
FIG. 25 illustrates the components and coupling of the components of the selector of the memory device in the fifth embodiment.

FIG. 25 illustrates components and coupling of the components of the WL selector and the BL selector of the memory device in the fifth embodiment. As illustrated in FIG. 25, the WL selector WS includes switches WSW as many as the memory cells MC coupled to each bit line BL. Each switch WSW is coupled to one global word line GWL at one end and is coupled to one word line WL at the other end. Each switch WSW is turned on or off by control of the read circuit 45 based on the address information ADD.

The BL selector BS includes switches BSW as many as the memory cells MC coupled to each word line WL. Each switch BSW is coupled to one bit line BL at one end and is coupled to the global bit line GBL at the other end. Each switch BSW is turned on or off by control of the read circuit 45 based on the address information ADD.

In the examples illustrated in FIGS. 20 to 25, the core circuit 41 includes three layers. A lowermost first layer includes the components illustrated in FIG. 24, that is, a set of the memory cell MC, the word line WL, the bit line BL, the WL selector WS, and the BL selector BS. A second layer includes the components illustrated in FIG. 22, that is, a set of the sub-core circuit SCC, the global word line GWL, the global bit line GBL, the GWL selector GWS, and the GBL selector GBS. A third layer includes the components illustrated in FIG. 20, that is, a set of the sub-core circuit set FCSC, the interconnect FWL, the interconnect FBL, the FWL selector FWS, and the FBL selector FBS.

The core circuit 41 may include four or more layers. In the case of the example of the four layers, the core circuit 41 includes a plurality of fourth layer sub-core circuit sets ECSCs, a plurality of interconnects EWL, a plurality of interconnects EBL, EWL selectors EWS, EBL selectors EBS, and interconnects DWL and DBL (all not illustrated) as in the first layer to the third layer.

Each sub-core circuit set ECSC is a set of a plurality of components and includes a plurality of memory cell arrays, a plurality of selectors, and a plurality of interconnects. Each sub-core circuit set ECSC is coupled to one interconnect EWL and one interconnect EBL.

Each interconnect EWL is coupled to a plurality of sub-core circuit sets ECSCs. Each interconnect EBL is coupled to a plurality of sub-core circuit sets ECSCs.

Each EWL selector EWS is a circuit that selects one of the plurality of interconnects EWL. Each EWL selector EWS receives the address information ADD and couples one of the plurality of interconnects EWL specified by the received address information ADD to the interconnect DWL.

Each EBL selector EBS is a circuit that selects one of the plurality of interconnects EBL. Each EBL selector EBS receives the address information ADD and couples one interconnect EBL specified by the received address information ADD among the plurality of interconnects EBL to the interconnect DBL.

The interconnect DWL and the interconnect DBL are coupled to the read circuit 45.

A fifth layer and a higher layer may be provided by the same structure.

The selector in each layer is switched on, whereby the selected word line WL is coupled to the read circuit 45. Similarly, the selector in each layer is switched on, whereby the selected bit line BL is coupled to the read circuit 45.

5.2.2. Read Circuit

Figure 26:
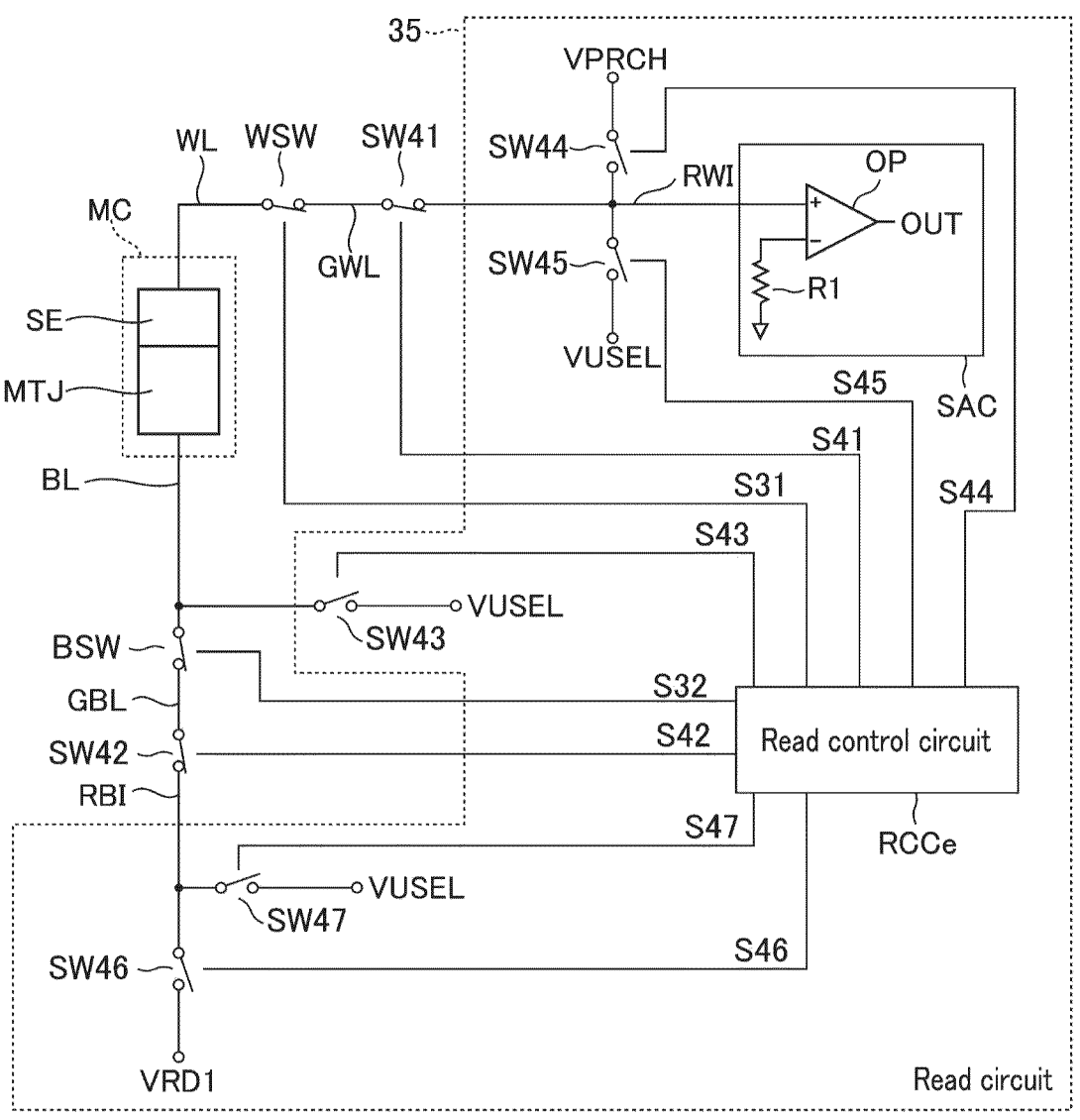
FIG. 26 illustrates an example of components and coupling of the components of a read circuit of the memory device in the fifth embodiment.

FIG. 26 illustrates an example of components and coupling of the components of the read circuit of the memory device according to the fifth embodiment. FIG. 26 illustrates, as a representative, a state at the time when certain one memory cell MC is selected. That is, as described above with reference to FIGS. 20 to 25, the selector in each layer remains on such that the selected word line WL and the selected bit line BL are coupled to the read circuit 45. FIG. 26 illustrates a path of electrical coupling from the selected word line WL to the read circuit 45 and a path of electrical coupling from the selected bit line BL to the read circuit 45 in a simplified form. Specifically, this is as described below.

The selected word line WL is actually coupled to the read circuit 45 via one turned-on switch of each layer and one interconnect of each layer. In the example of the three layers described above with reference to FIGS. 20 to 25, the selected word line WL is coupled to the read circuit 45 via one turned-on switch WSW, one turned-on switch GWSW, one turned-on switch FWSW, one global word line GWL, one interconnect FWL, and one interconnect EWL. However, all the switches between the switch WSW and the read circuit 45 are turned on or off at the same or substantially the same timing. Therefore, FIG. 26 illustrates the path of the electrical coupling between the switch WSW and the read circuit 45 as the global word line GWL, the switch SW41, and the interconnect RWI coupled in series. The interconnect RWI is an interconnect directly coupled to the read circuit 45.

The selected bit line BL is actually coupled to the read circuit 45 via one turned-on switch of each layer and one interconnect of each layer. In the example of the three layers described above with reference to FIGS. 20 to 25, the selected bit line BL is coupled to the read circuit 45 via one turned-on switch BSW, one turned-on switch GBSW, one turned-on switch FBSW, one global bit line GBL, one interconnect FBL, and one interconnect EBL. However, all the switches between the switch BSW and the read circuit 45 are turned on or off at the same or substantially the same timing. Therefore, FIG. 26 illustrates the path of the electrical coupling between the switch BSW and the read circuit 45 as the global bit line GBL, the switch SW42, and the interconnect RBI coupled in series. The interconnect RBI is an interconnect directly coupled to the read circuit 45.

As illustrated in FIG. 26, while the selected memory cell MC is selected, the read circuit 45 is coupled to the selected word line WL via a switch (a selected switch) WSW coupled to the selected word line WL, a global word line (a selected global word line) GWL coupled to the selected switch WSW, and a switch SW41 coupled to the selected global word line GWL.

While the selected memory cell MC is selected, the read circuit 45 is coupled to the selected bit line BL via a selected switch BSW coupled to the selected bit line BL, a global bit line (a selected global bit line) GBL coupled to the selected switch BSW, and a switch SW42 coupled to the selected global bit line GBL.

The switch WSW receives a signal S31. While receiving the signal S31 at the high level or the "H" level, the switch WSW is in an on state and maintains a state in which one end and the other end of the switch WSW are electrically coupled. While receiving the signal S31 at the low level or the "L" level, the switch WSW is in an off state and maintains a state in which one end and the other end of the switch WSW are electrically uncoupled.

The switch BSW receives a signal S32. While receiving the signal S32 at the high level or the "H" level, the switch BSW is in an on state and maintains a state in which one end and the other end of the switch BSW are electrically coupled. While receiving the signal S32 at the low level or the "L" level, the switch BSW is in an off state and maintains a state in which one end and the other end of the switch BSW are electrically uncoupled.

The read circuit 45 includes the sense amplifier circuit SAC, switches SW43 to SW47, interconnects RWI and RBI, and a read control circuit RCCe.

The switch SW43 is coupled between the bit line BL and a node that receives the non-selection voltage VUSEL. The switch SW44 is coupled between a node that receives the pre-charge voltage VPRCH and the interconnect RWI. The switch SW45 is coupled between the interconnect RWI and a node that receives the non-selection voltage VUSEL.

The sense amplifier circuit SAC is coupled to the interconnect RWI at the non-inverting input of the operational amplifier OP.

The switch SW46 is coupled between the node that receives the read voltage RD1 and the interconnect RBI. The switch SW47 is coupled between the interconnect RBI and a node that receives the non-selection voltage VUSEL.

The read control circuit RCCe outputs the signals S31 and S32 and signals S41 to S47.

5.2. Operation

FIG. 27 illustrates states of several signals during data reading of the memory device in the fifth embodiment along time. FIG. 27 illustrates a state in which a certain data read target memory cell MC is selected as illustrated in FIG. 26. That is, the signal S41 controls the switch SW41 that can couple the selected memory cell MC and the interconnect RWI. The signal S42 controls the switch SW42 that can couple the selected memory cell MC and the interconnect RBI. An operation in a period illustrated in FIG. 27 starts when data reading starts in a state in which the data read target memory cell MC is selected.

The signal S31 maintains the high level over the period illustrated in FIG. 27. Therefore, the selected word line WL is coupled to the selected global word line GWL. For this reason, the selected word line WL and the selected global word line GWL have the same potential changes over the period illustrated in FIG. 27.

The signal S41 maintains the high level over the period illustrated in FIG. 27. Therefore, the selected global word line GWL is coupled to the interconnect RWI. The signal S42 maintains the high level over the period illustrated in FIG. 27. Therefore, the selected bit line BL and the selected global bit line GBL are coupled to the interconnect RBI.

At time t41, the remaining signals, the voltage of the node, and the current have the following states. The signals S32, S44, and S46 have the low level and the signals S43, S45, and S47 have the high level. For this reason, the switches BSW, SW44, and SW46 are off, and the switches SW43, SW45, and SW47 are on.

Based on the switch SW43 being on and the switch BSW being off, the selected bit line BL is receiving the non-selection voltage VUSEL. Therefore, the selected bit line potential VBL has the non-selection potential VUSEL.

Based on the switch SW44 being off and the switch SW45 being on, the selected word line WL is receiving the non-selection voltage VUSEL. Therefore, the selected word line potential VWL has the non-selection potential VUSEL.

Based on the switch SW46 being off and the switch SW47 being on, the selected global bit line GBL is receiving the non-selection voltage VUSEL. Therefore, the potential VGBL (the selected global bit line potential VGBL) of the selected global bit line GBL has the non-selection potential VUSEL.

At time t42, the signal S44 is set to the high level and the signal S45 is set to the low level. Accordingly, the switch SW44 is turned on and the switch SW45 is turned off. Therefore, from time t42, the selected word line potential VWL rises and reaches the pre-charge potential VPRCH.

At time t42, the signal S46 is set to the high level and the signal S47 is set to the low level. Accordingly, the switch SW46 is turned on and the switch SW47 is turned off. Therefore, from time t42, the selected global bit line potential VGBL drops and reaches the read potential VRD1.

At time t42, the signal S43 is set to the low level. Accordingly, the switch SW43 is turned off and the selected bit line BL electrically floats. The selected bit line potential VBL remains at the non-selection potential VUSEL even after time t42.

At time t43, the signal S44 is set to the low level. Accordingly, the switch SW44 is turned off and the selected word line WL electrically floats. The selected word line potential VWL remains at the pre-charge potential VPRCH even after time t43.

At time t44, the signal S32 is set to the high level. Accordingly, the switch BSW is turned on. For this reason, charge sharing occurs between the selected bit line BL and the selected global bit line GBL. Based on this, as illustrated in FIG. 27, the selected bit line potential VBL drops and the selected global bit line potential VGBL rises. A change in potential due to the charge sharing is rapid, and thus the selected bit line potential VBL drops quickly.

At time t45, the difference between the selected word line potential VWL and the selected bit line potential VBL reaches the threshold voltage Vth. Accordingly, the switching element SE of the selected memory cell MC is turned on. Phenomena after this is the same as the phenomena after time t5 in the first embodiment.

5.3. Advantages

According to the fifth embodiment, the selected global bit line GBL functions as the dummy bit line BLDmy in the first embodiment, and the memory device 1e performs the same operation as the operation in the first embodiment using the selected global bit line GBL. That is, the selected bit line BL is uncoupled from the selected global bit line GBL and electrically floats during an initial stage of data reading and is thereafter coupled to the selected global bit line GBL having the read potential VRD1. Accordingly, the drop of the selected bit line potential VBL is performed by charge sharing between the selected bit line BL and the selected global bit line GBL. Therefore, the same advantages as those in the first embodiment can be obtained.

5.4. Modification

In the control described above with reference to FIG. 27, both of the charging of the selected word line WL and the discharging of the selected global bit line GBL are started at time t42. However, the charging of the selected word line WL and the discharging of the selected global bit line GBL may be started at different timings.

In the control described above with reference to FIG. 27, the signal S41 maintains the high level. However, the fifth embodiment is not limited to this control. As described above with reference to FIGS. 20 to 25, a plurality of switches (for eexmaple, switches GWSW and FWSW and the like) can be included between the interconnect RWI and the selected global word line GWL. It is not essential that these switches are turned on and off at the same timing. It is sufficient that at least the pre-charge voltage VPRCH can be applied to the global word line GWL from time t42. For example, the coupling of the interconnect RWI and the selected global word line GWL may be performed after time t41 and before time t42. Further, the plurality of switches may be turned on at different timings.

Similarly, it is not essential that the plurality of switches (for example, the switches GBSW and FBSW) between the interconnect RBI and the selected global bit line GBL are turned on and off at the same timing. It is sufficient that at least the read voltage VRD1 can be applied to the global bit line GBL from time t42. For example, the coupling of the interconnect RBI and the selected global bit line GBL may be performed after time t41 and before time t42. Further, the plurality of switches may be turned on at different timings.

The fifth embodiment may be combined with the second embodiment and/or the third embodiment.

The fifth embodiment may be combined with the fourth embodiment. That is, the array of the memory cells MC, the word line WL, and the bit line BL are realized by the structure illustrated in FIG. 16 in the fourth embodiment. Then, as in the fourth embodiment, the read circuit 45 is further configured to be able to supply a current from the selected bit line BL to the selected word line WL. FIG. 28 illustrates such an example and illustrates an example of components of a read circuit of a memory device in a modification in the fifth embodiment and coupling of the components. Like FIG. 26, FIG. 28 illustrates, as a representative, a state at the time when certain one memory cell MCB is selected.

The read circuit 45 further includes components illustrated in FIG. 28. Among the components in the read circuit 45, the components illustrated in FIG. 26 are used to read data from the memory cell MCA. That is, the memory cell MC and the word line WL illustrated in FIG. 26 are respectively the memory cell MCA and the word line WLA.

On the other hand, the components illustrated in FIG. 28 are used to read data from the memory cell MCB. The memory cell MCB and the word line WLB illustrated in FIG. 28 are respectively the memory cell MCB and the word line WLB.

The read circuit 45 further includes the sense amplifier circuit SAC2 and switches SW54 and SW56.

The switch SW54 is coupled between a node that receives the read voltage VRD1 and the interconnect RWI.

The sense amplifier circuit SAC2 is coupled to the interconnect RWI at the non-inverting input of the operational amplifier OP.

The switch SW56 is coupled between the interconnect RBI and a node that receives the pre-charge voltage VPRCH.

The read control circuit RCCe further outputs signals S54 and S56.

An overview of the data reading from the memory cell MCB is the same as the overview of the data reading from the memory cell MCA, that is, the operation described above with reference to FIG. 27 except for inversion of the potentials of the word line WL and the bit line BL.

FIG. 29 illustrates states of several signals during data reading of the memory device in the modification in the fifth embodiment. FIG. 29 illustrates a state at the time when certain one data read target memory cell MC is selected as illustrated in FIG. 28. An operation in a period illustrated in FIG. 29 starts when data reading starts in a state in which the data read target memory cell MC is selected.

The signal S31 maintains the high level over the period illustrated in FIG. 29. Therefore, the selected word line WL is coupled to the selected global word line GWL. The signal S41 maintains the high level over the period illustrated in FIG. 29. Therefore, the selected global word line GWL is coupled to the interconnect RWI. The signal S42 maintains the high level over the period illustrated in FIG. 29. Therefore, the selected global bit line GBL is coupled to the interconnect RBI.

At time t51, the remaining signals, the voltage of the node, and the current have the following states. The signals S32, S54, and S56 have the low level and the signals S43, S45, and S47 have the high level. Therefore, the switches BSW, SW54, and SW56 are off and the switches SW43, SW45, and SW47 are on.

Based on the switch SW43 being on and the switch BSW being off, the selected bit line potential VBL has the non-selection potential VUSEL.

Based on the switch SW54 being off and the switch SW45 being on, the selected word line potential VWL has the non-selection potential VUSEL.

Based on the switch SW56 being off and the switch SW47 being on, the selected global bit line potential VGBL has the non-selection potential VUSEL.

At time t52, the signal S54 is set to the high level and the signal S45 is set to the low level. Accordingly, the switch SW54 is turned on and the switch SW45 is turned off. Therefore, from time t52, the selected word line potential VWL drops and reaches the read potential VRD1.

At time t52, the signal S56 is set to the high level and the signal S47 is set to the low level. Accordingly, the switch SW56 is turned on and the switch SW47 is turned off. Therefore, from time t52, the selected global bit line potential VGBL rises and reaches the pre-charge potential VPRCH.

At time t52, the signal S43 is set to the low level. Accordingly, the switch SW43 is turned off and the selected bit line BL electrically floats.

At time t53, the signal S54 is set to the low level. Accordingly, the switch SW54 is turned off and the selected word line WL electrically floats.

At time t54, the signal S32 is set to the high level. Accordingly, the switch SW43 is turned on. For this reason, charge sharing occurs between the selected bit line BL and the selected global bit line GBL. Based on this, as illustrated in FIG. 27, the selected bit line potential VBL rises and the selected global bit line potential VGBL drops.

At time t55, the difference between the selected word line potential VWL and the selected bit line potential VBL reaches the threshold voltage Vth. Accordingly, the switching element SE of the selected memory cell MC is turned on. The phenomena after this is the same as the phenomena after time t35 in the fourth embodiment.

According to the modification, even when a relation between the potential of the word line WL and the potential of the bit line BL is opposite to the relation in the basic form in the fourth embodiment, data can be read at high speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a memory cell including a first end and a second end;
a first interconnect coupled to the first end;
a first switch coupled between the first interconnect and a first node, the first node receiving a first voltage;
a second interconnect coupled to the second end;
a second switch including a third end coupled to the second interconnect and a fourth end;
a third interconnect coupled to the fourth end;
a third switch coupled between the third interconnect and a second node, the second node receiving a second voltage different from the first voltage; and
a controller configured to:
apply a third voltage between the second voltage and the first voltage to the first interconnect and the second interconnect,
turn on the third switch,
turn off the third switch and turn on the second switch after the third switch is turned on and after the application of the third voltage, and
turn off the first switch after the application of the third voltage.

2. The memory device according to claim 1, wherein the first interconnect is electrically floating while the first switch is off.

3. The memory device according to claim 2, wherein the second interconnect is electrically floating while the third switch is off and the second switch is on.

4. The memory device according to claim 1, wherein the second interconnect is electrically floating while the third switch is off and the second switch is on.

5. The memory device according to claim 1, wherein the first switch and the second switch are maintained off during a first period,
the second switch is maintained off and the first switch is maintained on during a second period after the first period,
the first switch and the second switch are maintained off during a third period after the second period,
the third switch is maintained on until an end of the third period, and
the first switch and the third switch are maintained off and the second switch is maintained on during a fourth period after the third period.

6. The memory device according to claim 5, further comprising:

a fourth switch coupled between the first interconnect and a third node that receives the third voltage; and a fifth switch coupled between the second interconnect and the third node, wherein the fourth switch and the fifth switch are maintained on during the first period, the fourth switch is maintained off and the fifth switch is maintained on during the second period and the third period, and the fourth switch and the fifth switch are maintained off during the fourth period.

7. The memory device according to claim 5, further comprising a sixth switch coupled between the second interconnect and a node that receives the second voltage, wherein the sixth switch is maintained off during the first period, the second period, and the third period, and the sixth switch is maintained on during the fourth period.

8. The memory device according to claim 7, wherein the memory cell includes a variable resistance material, and the variable resistance material includes a fifth end and a sixth end, has a first resistance between the fifth end and the sixth end once the variable resistance material receives a positive fifth voltage from the fifth end toward the sixth end, has a second resistance lower than the first resistance between the fifth end and the sixth end once the variable resistance material receives a positive sixth voltage lower than the fifth voltage from the fifth end toward the sixth end, has a third resistance between the fifth end and the sixth end once the variable resistance material receives a positive seventh voltage from the sixth end toward the fifth end, and has a fourth resistance lower than the third resistance between the fifth end and the sixth end once the variable resistance material receives a positive eighth voltage lower than the seventh voltage from the sixth end toward the fifth end.

9. The memory device according to claim 8, wherein the memory cell further includes:

a first ferromagnetic layer;

a second ferromagnetic layer; and an insulating layer between the first ferromagnetic layer and the second ferromagnetic layer.

10. The memory device according to claim 5, further comprising:

a fourth interconnect coupled between the first node and the first switch; and a seventh switch coupled between the fourth interconnect and the first node, wherein the first switch and the second switch are maintained off and the seventh switch is maintained on during a fifth period before the first period, the seventh switch is maintained on during the first period, and the seventh switch is maintained off during the second period, the third period, and the fourth period.

11. The memory device according to claim 10, wherein the memory cell includes a variable resistance material, and the variable resistance material includes a fifth end and a sixth end, has a first resistance between the fifth end and the sixth end once the variable resistance material receives a positive fifth voltage from the fifth end toward the sixth end, has a second resistance lower than the first resistance between the fifth end and the sixth end once the variable resistance material receives a positive sixth voltage lower than the fifth voltage from the fifth end toward the sixth end, has a third resistance between the fifth end and the sixth end once the variable resistance material receives a positive seventh voltage from the sixth end toward the fifth end, and has a fourth resistance lower than the third resistance between the fifth end and the sixth end once the variable resistance material receives a positive eighth voltage lower than the seventh voltage from the sixth end toward the fifth end.

12. The memory device according to claim 11, wherein the memory cell further includes:

a first ferromagnetic layer;

a second ferromagnetic layer; and an insulating layer between the first ferromagnetic layer and the second ferromagnetic layer.

13. The memory device according to claim 1, wherein the memory cell includes a variable resistance material, and the variable resistance material includes a fifth end and a sixth end, has a first resistance between the fifth end and the sixth end once the variable resistance material receives a positive fifth voltage from the fifth end toward the sixth end, has a second resistance lower than the first resistance between the fifth end and the sixth end once the variable resistance material receives a positive sixth voltage lower than the fifth voltage from the fifth end toward the sixth end, has a third resistance between the fifth end and the sixth end once the variable resistance material receives a positive seventh voltage from the sixth end toward the fifth end, and has a fourth resistance lower than the third resistance between the fifth end and the sixth end once the variable resistance material receives a positive eighth voltage lower than the seventh voltage from the sixth end toward the fifth end.

14. The memory device according to claim 13, wherein the memory cell further includes:

a first ferromagnetic layer;

a second ferromagnetic layer; and an insulating layer between the first ferromagnetic layer and the second ferromagnetic layer.

*  *  *  *  *